| (12) | United States Patent | (10) Patent No.: | US 12,495,521 B2 |
|---|---|---|---|
| | Zhai | (45) Date of Patent: | Dec. 9, 2025 |

(54) LIQUID-COOLING SERVER SYSTEM INCLUDE AT LEAST ONE POWER-SIGNAL BRIDGE ADJUSTABLY MOUNTED AND A LIQUID-COOLED SERVER WITH A SEALED HEAT DISSIPATING FINNED HOUSING

(71) Applicant: Hengliang Zhai, Shanghai (CN)

(72) Inventor: Hengliang Zhai, Shanghai (CN)

( * ) Notice: Subject to any disclaimer, the term of this patent is extended or adjusted under 35 U.S.C. 154(b) by 0 days.

(21) Appl. No.: 19/185,695

(22) Filed: Apr. 22, 2025

(65) Prior Publication Data

US 2025/0254826 A1    Aug. 7, 2025

Related U.S. Application Data

(63) Continuation of application No. PCT/CN2022/139582, filed on Dec. 16, 2022.

(30) Foreign Application Priority Data

Dec. 12, 2022 (CN) .......................... 202211595891.0

(51) Int. Cl.
 *H05K 7/20* (2006.01)
 *H05K 7/14* (2006.01)
 *H05K 7/18* (2006.01)

(52) U.S. Cl.
 CPC ..... *H05K 7/20272* (2013.01); *H05K 7/20236* (2013.01); *H05K 7/20409* (2013.01);
 (Continued)

(58) Field of Classification Search
 CPC .. H05K 7/183; H05K 7/1485; H05K 7/20236; H05K 7/20272; H05K 7/20409;
 (Continued)

(56) References Cited

U.S. PATENT DOCUMENTS 10,334,748 B1 *  6/2019  Kostenko ............... H05K 7/026
2015/0062806 A1   3/2015  Shelnutt et al.
(Continued)

FOREIGN PATENT DOCUMENTS

CN    108811472 A    11/2018
CN    112650373 A     4/2021
(Continued)

*Primary Examiner* — Jayprakash N Gandhi
*Assistant Examiner* — Steven Ngo

(57) ABSTRACT

The present invention discloses a server liquid-cooling system. Conventional server cooling methods in data centers, such as air cooling, often suffer from high energy consumption and excessive noise. Existing liquid-cooling technologies, such as spray-type systems, are power-intensive, while immersion-type systems are prone to oxidation. Additionally, some liquid-cooling systems feature rigid configurations with limited adaptability. The liquid-cooling server system disclosed herein comprises a coolant liquid tank structure and a liquid-cooled server. The server has a flat, box-shaped configuration, with internal electrical and functional components sealed in an enclosure filled with nitrogen gas. The server is suspended within a server mounting rack inside the coolant liquid tank via T-shaped guide slot and positioning handle. Natural water is used as the cooling medium. This system is primarily intended for server cooling in large-scale data centers, as it enables high-density deployment and offers advantages including low power consumption, enhanced safety, stability, and broad applicability.

19 Claims, 35 Drawing Sheets

(52) U.S. Cl.
CPC ..... *H05K 7/20636* (2013.01); *H05K 7/20772* (2013.01); *H05K 7/1485* (2013.01); *H05K 7/183* (2013.01)

(58) Field of Classification Search
CPC ........... H05K 7/20627; H05K 7/20636; H05K 7/20763; H05K 7/20772; H01L 23/40; H01L 23/44; H01L 23/46; H01L 23/473; G06F 1/20
See application file for complete search history.

(56) References Cited

U.S. PATENT DOCUMENTS

| | | | |
|---|---|---|---|
| 2015/0334880 A1* | 11/2015 | Best ................... | H05K 7/20836 361/679.47 |
| 2019/0307000 A1* | 10/2019 | Sion ........................ | G06F 1/182 |
| 2021/0144882 A1* | 5/2021 | Li ........................ | H05K 7/20263 |
| 2022/0104394 A1* | 3/2022 | Boyd .................. | H05K 7/20272 |
| 2022/0225541 A1* | 7/2022 | Chen ........................ | G06F 1/182 |
| 2022/0248564 A1* | 8/2022 | Moon ................ | H05K 7/20236 |
| 2022/0361366 A1* | 11/2022 | Hsieh ................ | H05K 7/20236 |
| 2022/0361381 A1* | 11/2022 | Sweeney ............ | H05K 7/20263 |

FOREIGN PATENT DOCUMENTS

| | | |
|---|---|---|
| CN | 217113188 U | 8/2022 |
| WO | 2016036316 A1 | 3/2016 |

\* cited by examiner

LIQUID-COOLING SERVER SYSTEM INCLUDE AT LEAST ONE POWER-SIGNAL BRIDGE ADJUSTABLY MOUNTED AND A LIQUID-COOLED SERVER WITH A SEALED HEAT DISSIPATING FINNED HOUSING

CROSS-REFERENCE TO RELATED APPLICATIONS

The present application is a continuation of International Application No. PCT/CN2022/139582, filed on Dec. 16, 2022, which claims priority to Chinese Patent Application No. 202211595891.0, filed on Dec. 12, 2022, the entire disclosure of which is incorporated herein by reference.

TECHNICAL FIELD

The present invention relates to the field of liquid-cooling technologies for servers, and more particularly to a liquid-cooling server system.

BACKGROUND

In data center environments, servers typically impose stringent requirements for heat dissipation. Conventional cooling methods primarily rely on air-based systems, such as computer room air conditioners and fans, which consume substantial electrical power and generate significant noise. With the increasing server density in modern deployments, traditional server enclosures or cabinets combined with air cooling are no longer sufficient to meet thermal management demands. In response to these limitations, liquid-cooling technologies for servers have emerged. The basic principle of liquid cooling involves using a cooling medium to directly remove heat from heat-generating components within the server. Compared to conventional air cooling, liquid-cooling systems offer higher heat exchange density, better energy efficiency, reduced noise, and the potential for thermal energy recovery.

Several existing liquid-cooled server systems, however, still suffer from notable drawbacks. For example, one known liquid-cooled server cabinet utilizes an overhead spray mechanism, in which a liquid pump circulates coolant through piping and sprays it from the top of the cabinet. This approach consumes additional electrical energy and poses a risk of internal temperature instability upon pump failure. Another example is an immersion-cooled server, where the server motherboard is fully submerged in a coolant. Over time, however, the coolant can oxidize the motherboard, shortening its lifespan. Furthermore, such systems generally consolidate all server components and heat sources onto a single motherboard, lacking modularity. A failure in a localized area of the motherboard may result in total system failure. Yet another design features a rack-type immersion phase-change server system with a top-mounted cooling module. Each server receives coolant independently, which absorbs heat and undergoes a liquid-to-gas phase transition. The system employs a shared cooling module and branch piping for liquid circulation. However, the fixed spatial dimensions and layout limit scalability and adaptability, while the complex piping network reduces practicality. Additionally, most existing systems rely on proprietary or chemical coolants that are costly and pose environmental hazards. Accordingly, there remains a need for an improved liquid-cooling server system.

SUMMARY OF THE INVENTION

The present invention provides a liquid cooling server system designed to overcome the limitations described above.

To address the foregoing technical problems, the present invention provides technical solution as follows:

The liquid cooling server system disclosed comprises a coolant liquid tank structure having a trough-shaped sealed liner, and one or more servers immersed below the coolant level inside the coolant liquid tank. The system is configured such that the coolant may be ordinary water rather than specialized or chemical coolants, thereby improving environmental sustainability and reducing operating costs. The system minimizes reliance on traditional air conditioning, thereby achieving a low-carbon, energy-saving operational profile.

The coolant liquid tank structure includes a lower sealing plate peripherally disposed about the trough-shaped sealed liner; an upper sealing plate superjacent to the lower sealing plate; at least one power-signal bridge adjustably mounted to positioning frame reinforcement ribs on a crossbeam atop the trough-shaped liner; a server positioning frame interposed between opposing positioning frame reinforcement ribs; a coolant monitoring device disposed beneath the server positioning frame; a coolant feed mechanism arranged on one side of the coolant liquid tank; a coolant outlet mechanism arranged on the opposite side of the coolant liquid tank; and a tank control module located laterally on the lower sealing plate.

The server is suspended from the server positioning frame in an array configuration within the coolant tank structure, with its bottom submerged below the coolant level and its output terminal located at the top; The server is in the form of a flat box, comprising a sealed heat-dissipating finned housing, a sealing cover with handgrip positioning lugs at bilateral top edges, and internal electrical components; Alignment and suspension are achieved via interaction between T-shaped alignment channels on lateral surfaces of said housing and said handgrip positioning lugs with the server positioning frame.

Further, the lower sealing plate is detachably engaged with the vertical beams at corner positions of the trough-shaped sealed liner through side panel mounting hooks inserted into panel mounting apertures. Said vertical beams further incorporate cable routing slots for electrical cabling.

Further, the power-signal bridge adopts a gantry-type configuration, with its bottom mechanically coupled to the top crossbeam of the trough-shaped sealed liner via an inverted concave engagement structure. The server positioning frame is bolted to the positioning frame reinforcement rib via connecting tabs with alignment holes and mounting bolts.

Further, the upper crossbeam of the power-signal bridge houses PDU power receptacles concealed by a bridge cover plate, with laterally spaced outlet holes formed on both sides.

Further, the server positioning frame includes a plurality of server positioning slots laterally spaced along both longitudinal sides. Two parallel rows of positioning threaded fasteners with T-shaped handle at upper ends are threadably coupled to said frame;

Further, a sensor mounting beam is affixed to the bottom of the server positioning frame via connecting members. The sensor mounting beam is secured using sensor beam fixing bolts. The coolant monitoring devices including high-level, medium-level, and low-level temperature sensors, and a liquid level transducer.

Further, the coolant feed mechanism is configured with a feed chamber, multiple feed distribution conduits extending upwardly from the feed chamber, and a main feed pipe connected to each distribution pipe. The main feed pipe is secured using a valve pipe positioning clamp, and equipped at its input end with a main inlet solenoid valve, an inlet flow sensor, and a manual main valve. A coolant inlet port in communication with the feed chamber is formed between the chamber and the sealed liner.

Further, the coolant outlet structure comprises a drainage overflow chamber, multiple drainage overflow branch pipes connected to the bottom thereof, and a drain pipe coupled to the overflow branches. A drainage flow sensor and a solenoid drainage valve are mounted on the drain pipe. Overflow liquid level discharge ports in fluid communication with the drainage overflow chamber are formed at horizontal intervals on the top beam surface of the sealed liner on the same side.

Further, the operation control apparatus for the coolant liquid tank includes a controller electrically connected to liquid level transmitter, network switch, power circuit breaker, emergency brake switch, forced inlet button, and forced drainage button. The power circuit breaker is mounted to the rear opening of the bottom sealing plate via DIN rail and sealed using a power compartment cover fixed via installation bolts.

Further, support legs are provided at the bottom of the coolant tank structure.

Further, the sealed cover is hermetically coupled to the heat-dissipating finned housing via sealing nuts and gaskets.

Further, the lifting handle positioning bar is of an open design and cooperates with the T-shaped handle and the server positioning connection screw for secure locking. The T-shaped guide slot aligns and engages with the server positioning slot to ensure guided sliding and positional locking.

Further, the wiring output terminal comprises a waterproof data interface protruding from the sealed top cover, waterproof data output cables, a waterproof power reset button, waterproof power terminal, waterproof RF antenna, and an exhaust valve. Indicator lights are mounted on the surface of the sealed cover via indicator light nuts.

Further, the internal electrical components of the server are mounted on at least one inner sidewall of the heat-dissipating finned housing.

Further, these components include a heat collecting plate installed on a positioning protrusion of the inner wall of finned housing via mounting guide grooves. Memory heat collectors, memory modules, GPU heat collector arrays, and GPU are mounted to the heat collecting plate via collector bolts. A hard disk drive HDD, server power supply, and intelligent temperature-humidity-oxygen controller are also mounted to the plate. The server motherboard is mounted via positioning bolts, and a CPU module, CPU heat collector, GPU assembly, and computational unit assembly are installed on the motherboard via a CPU bracket.

Further, a thermal conductive film is disposed between the heat collecting plate and the inner wall of the finned housing.

Further, the interior of the server is filled with nitrogen gas.

A liquid-cooled server coolant tank structure for the liquid-cooled server system of the present invention, which describes the structural features of the coolant tank.

A liquid-cooled server for the liquid-cooled server system of the present invention, which describes the structural features of the server.

The present invention provides the following advantages over the prior art:

(1) The coolant tank structure can exist independently and is suitable for use with servers of various models, rather than requiring a specific model of server. This allows for efficient and convenient assembly of the server and coolant tank structure for use together.

(2) The liquid-cooled serve achieves liquid cooling through immersion method, which distinguishes it from the prior art. The power consumption required to maintain the stable state is limited to the electromagnetic valve, sensors, and controller, resulting in low power loss.

(3) The server is arranged in a suspended array that is adjustable in position. The server model and size are selectable, making it conducive to large-scale server liquid cooling setups. This contrasts with the prior art's cooling of small-sized individual servers, and allows for the implementation of high-density, large-scale server cooling applications in industrial scenarios.

(4) The server adopts a sealed internal structure, with all electrical components located inside, leaving only the top exposed. The interior is filled with nitrogen gas and a corresponding exhaust valve is installed. This ensures efficient isolation of internal components from the external coolant liquid, guaranteeing the safety and stability of the internal components. The coolant liquid can directly use natural water, without the need for specialized or chemical coolants, thus improving environmental requirements. This also minimizes expenditures on air conditioning systems, achieving environmentally friendly, energy-saving, and low-carbon operation.

(5) The gantry-style power signal line bridge facilitates the management and positioning of wiring output terminals and cables on the top of the installed server, ensuring stability in output and connection. Additionally, the server positioning frame is located on the power signal line bridge, making it easier for positioning and routing. The positioning frame is connected to the positioning ribs via positioning bolts, which allows for adjustment of position and distance according to different server sizes and models, thereby improving versatility and applicability.

(6) The bottom sealing plate of the coolant tank is connected to the corner vertical beams of the trough-shaped sealed liner via detachable panel mounting hooks and corresponding mounting holes. The vertical beams are also equipped with cable routing slots, making this detachable connection method convenient for maintenance and repairs, while enhancing the overall aesthetic. The cable routing slots allow for neat wiring and avoid cable clutter.

(7) High-level, mid-level, and low-level temperature sensors are installed to detect the temperature data corresponding to different liquid levels in the coolant liquid, enabling efficient and safe monitoring.

Implementing any product of the present invention does not necessarily require all the above-mentioned advantages to be achieved simultaneously.

BRIEF DESCRIPTION OF THE DRAWINGS

To clearly illustrate the technical solutions of the embodiments of the present invention, the following is a brief description of the drawings used in the embodiment descriptions. Evidently, the drawings below represent only some embodiments of the present invention, and those skilled in the art, without inventive effort, can derive other FIGS. based on these drawings.

LIST OF REFERENCE NUMERALS IN THE DRAWINGS

Figure 1:
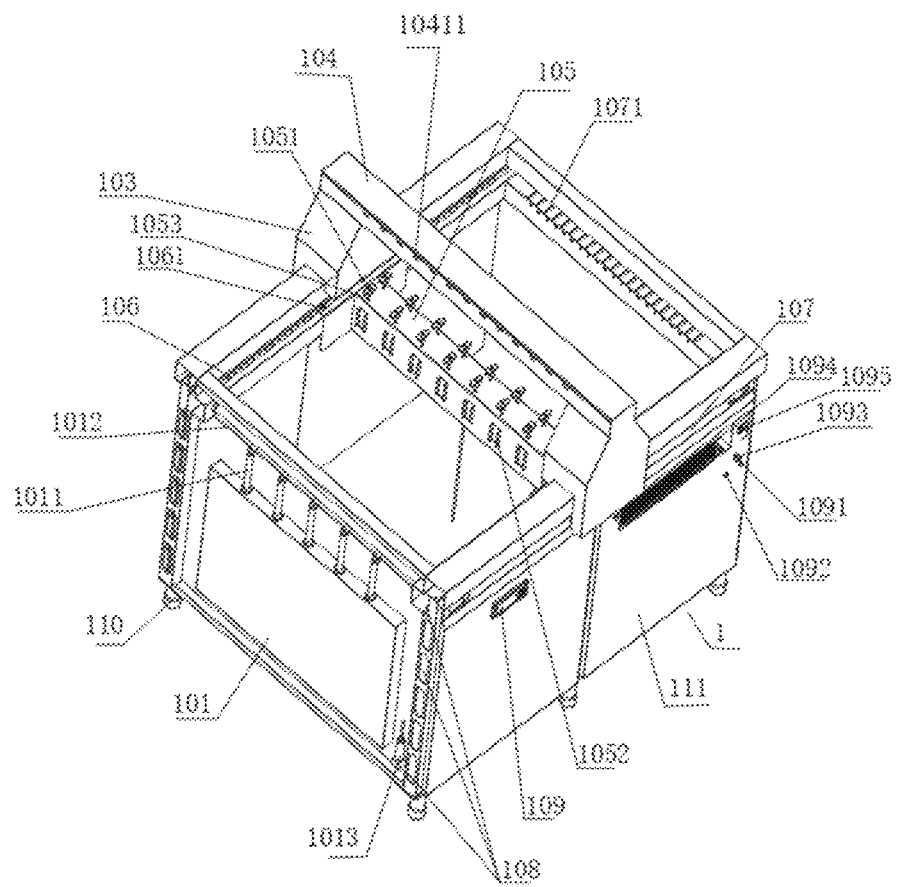
FIG. 1 is a schematic diagram of the coolant tank structure in a liquid-cooled server system according to the embodiment 1 of the present invention.
Figure 2:
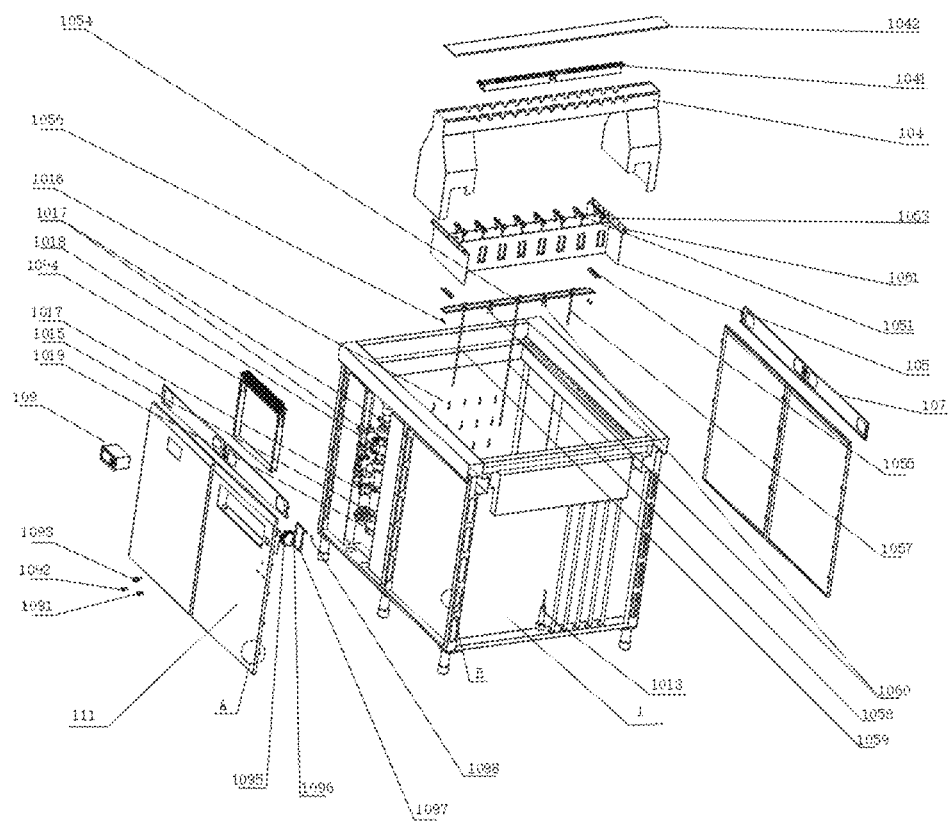
FIG. 2 is an exploded view of the structure shown in FIG. 1.
Figure 3:
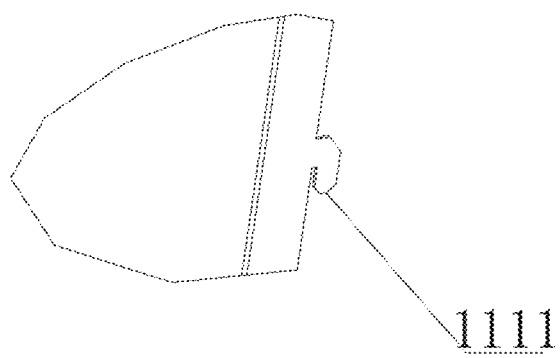
FIG. 3 is a partial enlarged view of position A in FIG. 2.
Figure 4:
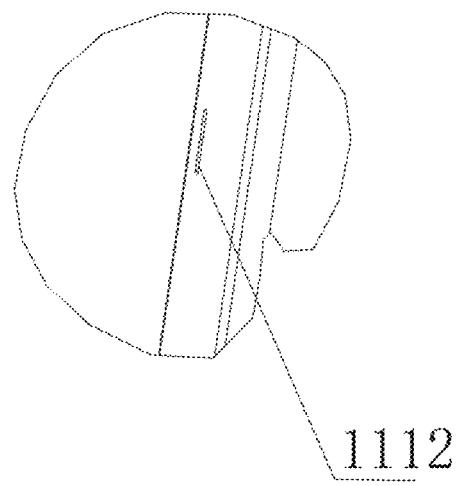
FIG. 4 is a partial enlarged view of position B in FIG. 2.
Figure 5:
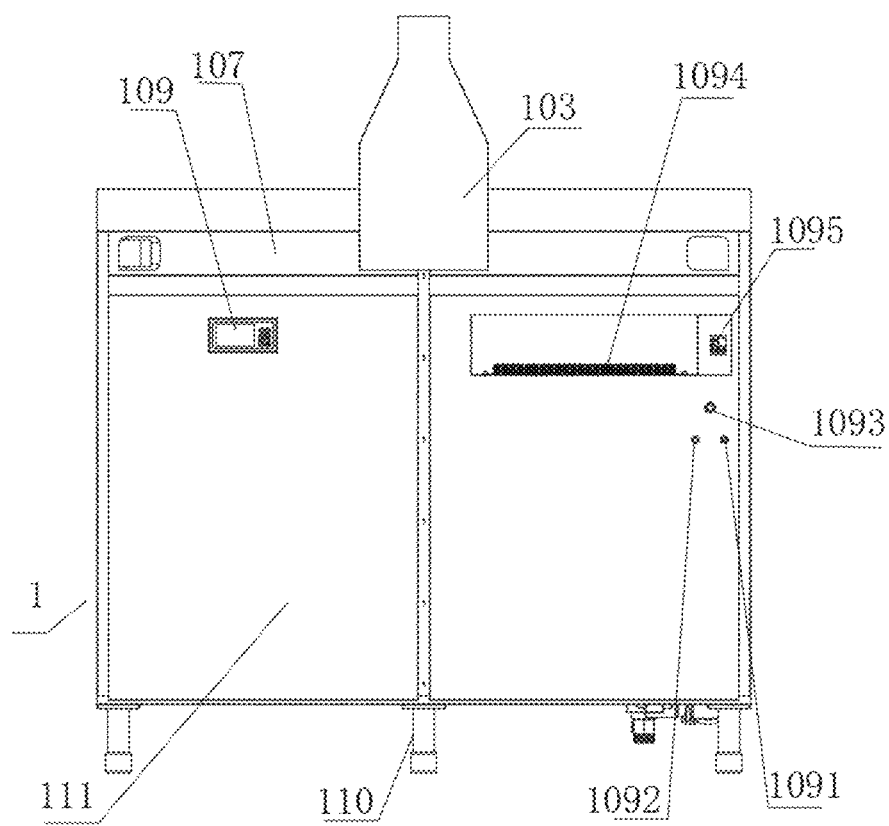
FIG. 5 is a right-side view of the structure shown in FIG. 1.
Figure 6:
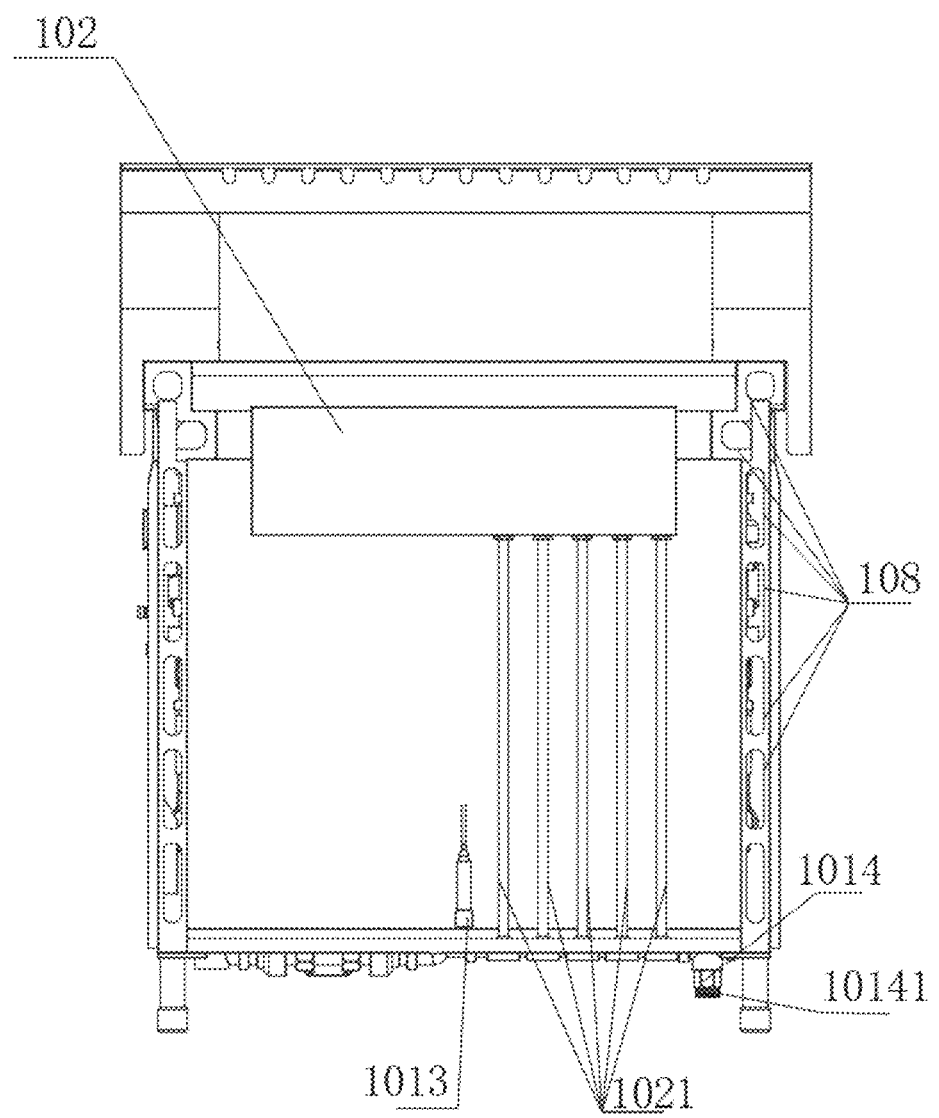
FIG. 6 is a rear view of the structure shown in FIG. 1.
Figure 7:
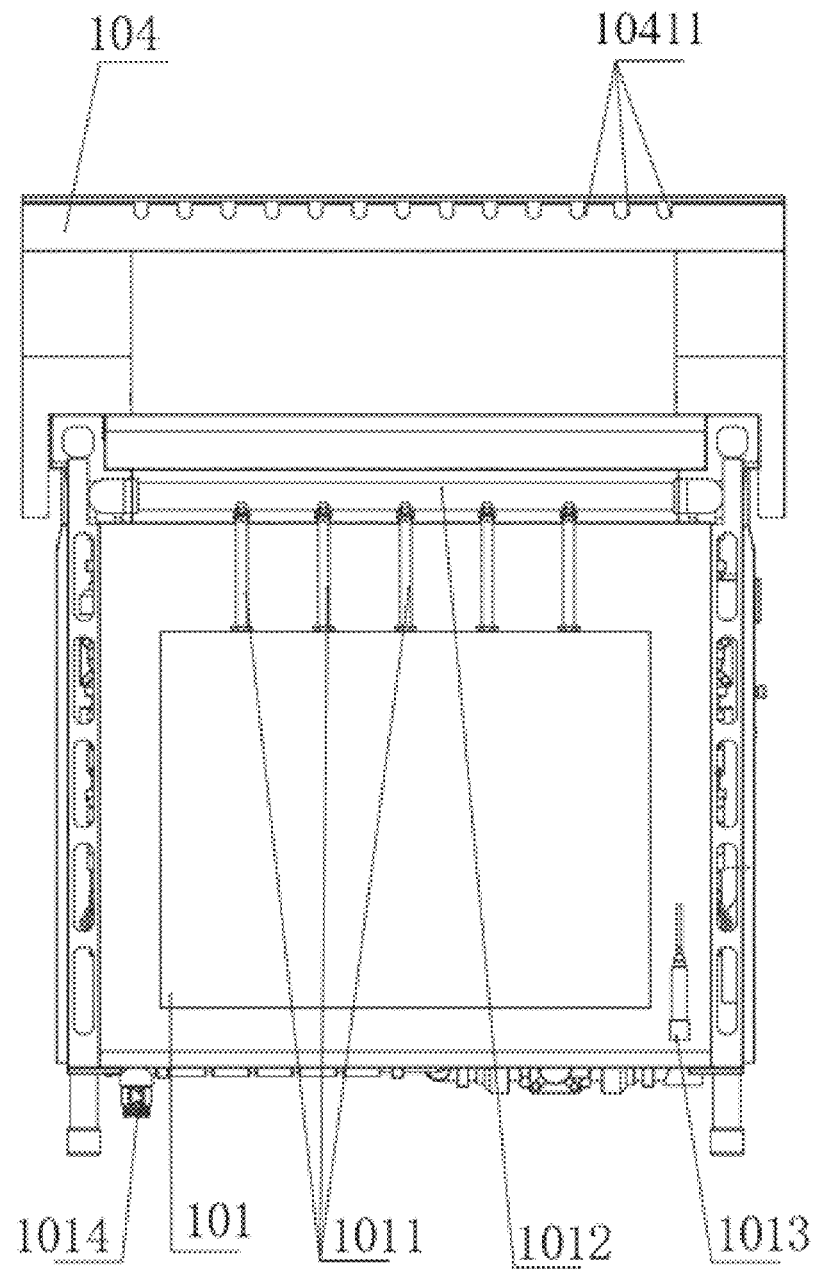
FIG. 7 is a front view of the structure shown in FIG. 1.
Figure 8:
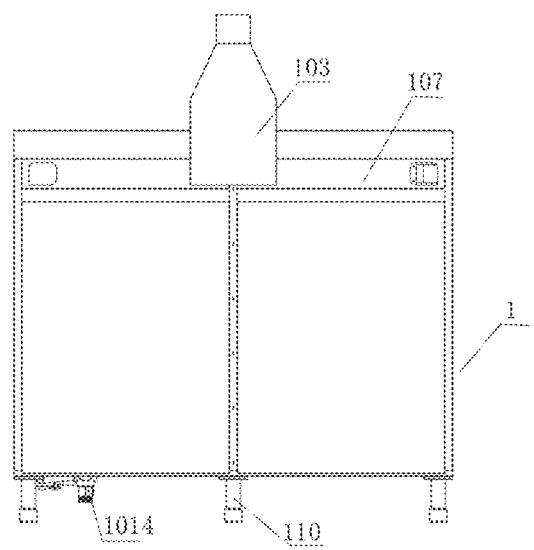
FIG. 8 is a left-side view of the structure shown in FIG. 1.
Figure 9:
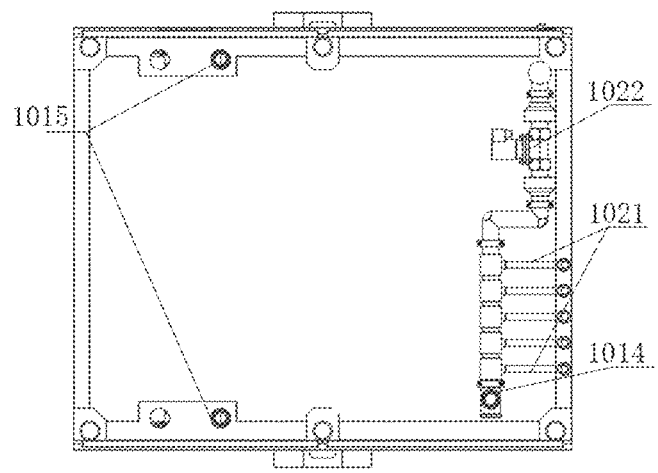
FIG. 9 is an upward view of the structure shown in FIG. 1.
Figure 10:
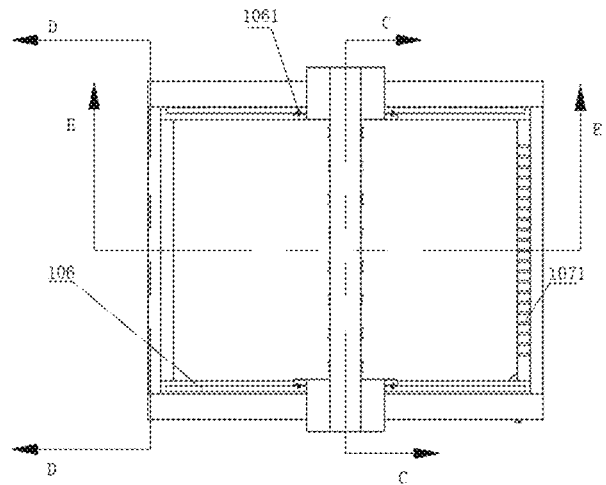
FIG. 10 is a top view of the structure shown in FIG. 1.
Figure 11:
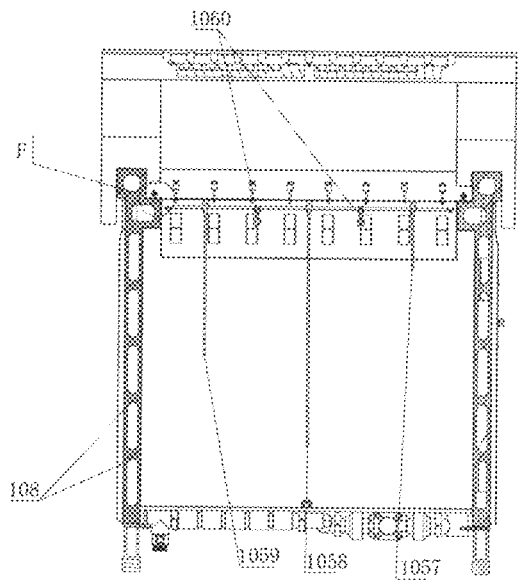
FIG. 11 is a cross-sectional view taken along line C-C of FIG. 10.
Figure 12:
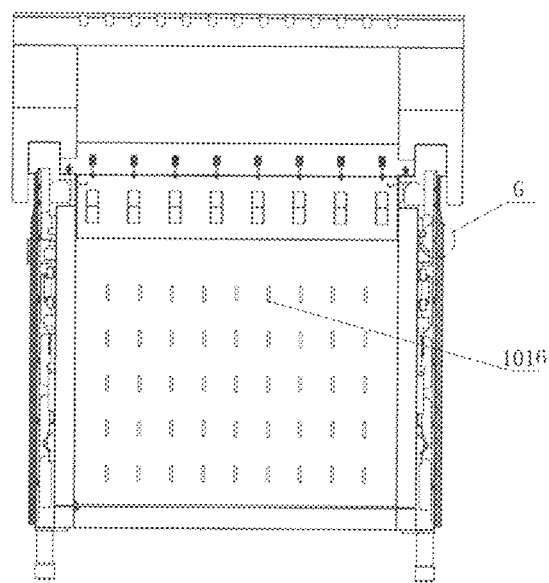
FIG. 12 is a cross-sectional view taken along line D-D of FIG. 10.
Figure 13:
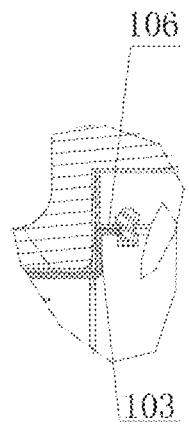
FIG. 13 is a partial enlarged view of position F in FIG. 11.
Figure 14:
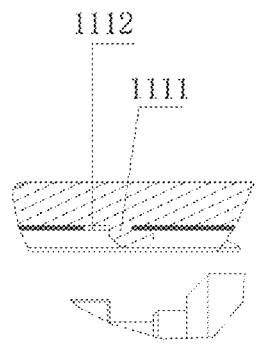
FIG. 14 is a partial enlarged view of position G in FIG. 12.
Figure 15:
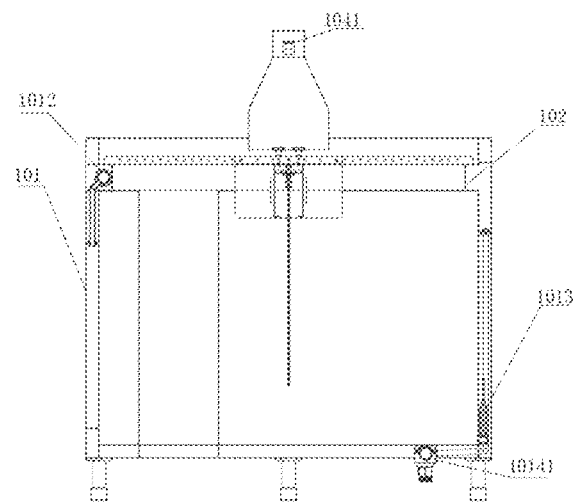
FIG. 15 is a cross-sectional view taken along line E-E of FIG. 10.

1—coolant tank structure, 101—feed chamber, 1011—Inlet liquid distribution pipe, 1111—Sealing plate mounting hook, 1112—Sealing plate mounting hole, 1012—Main liquid feed pipe, 1013—Liquid level transmitter, 1014—Drain flow sensor, 10141—Drain pipe, 1015—Support, 1016—Liquid inlet hole, 1017—Valve pipe positioning clamp, 1018—Main liquid inlet solenoid valve, 1019—Manual main valve, 102—Drain overflow chamber, 1021—Water overflow branch pipe, 1022—Electromagnetic drainage valve, 103—Inverted "concave" structure, 104—Power signal bridge, 1041—PDU power interface, 1042—Bridge cover, 105—Server positioning frame, 1051—T-handle, 1052—Server positioning slot, 1053—Server positioning connection screw, 1054—Sensor installation beam, 1055—Connector, 1056—Sensor beam fixing bolt, 1057—High liquid level temperature sensor, 1058—Low liquid level temperature sensor, 1059—Medium liquid level temperature sensor, 1060—Liquid level sensor, 1061—Positioning frame bolt, 106—Positioning frame rib, 107—Sealing plate on top of coolant tank, 1071—Drain overflow hole, 108—Cable trough hole, 109—Controller, 1091—Forced liquid supply button, 1092—Forced drainage button, 1093—Emergency brake switch for coolant tank, 1094—Switch, 1095—Circuit breaker, 1096—DIN rail, 1097—Power chamber cover, 1098—Power chamber cover installation bolt, 110—coolant tank support foot, 111—coolant tank bottom sealing plate, 2—Server, 201—T-guide positioning slot, 202—Heat sink housing, 2021—Sealing gasket, 2022—Thermal film, 2023—HDD hard drive, 2025—Nitrogen fill, 2026—Heat collecting plate, 20261—Heat collecting plate installation guide slot, 203—Sealing cover, 2031—Sealing nut, 2032—Handle positioning handle, 204—Exhaust valve, 205—Waterproof data interface, 206—Waterproof RF antenna, 207—Waterproof output data cable, 208—Waterproof power reset button, 209—Waterproof power wire terminal, 210—Indicator nut sealing cover, 2101—Indicator light, 211—Server motherboard, 2111—CPU group, 21111—CPU bracket, 2112—CPU heat sink, 2113—Computing unit assembly, 2114—Intelligent temperature, humidity, and oxygen controller, 2115—Memory heat sink array, 2116—Heat sink bolt, 2117—Memory stick, 2118—Server power supply, 2444—Motherboard mounting positioning bolt, 3—Coolant liquid.

DETAILED DESCRIPTION

The following describes the technical solutions of the embodiments of the present invention, as shown in the accompanying drawings. It should be expressly noted that the described embodiments are merely exemplary and not exhaustive. All other embodiments obtained by persons of ordinary skill in the art based on the embodiments herein without creative efforts shall fall within the protection scope of the present invention.

In the description of the present invention, terms such as "internal," "external," "upper," "lower," "bottom," "side," "top," "array," and other directional terms are used for convenience in describing the present invention and simplifying the description. They do not indicate or imply that the components or elements described must have a specific orientation or construction, and should not be construed as limiting the invention in any way.

Figure 63:
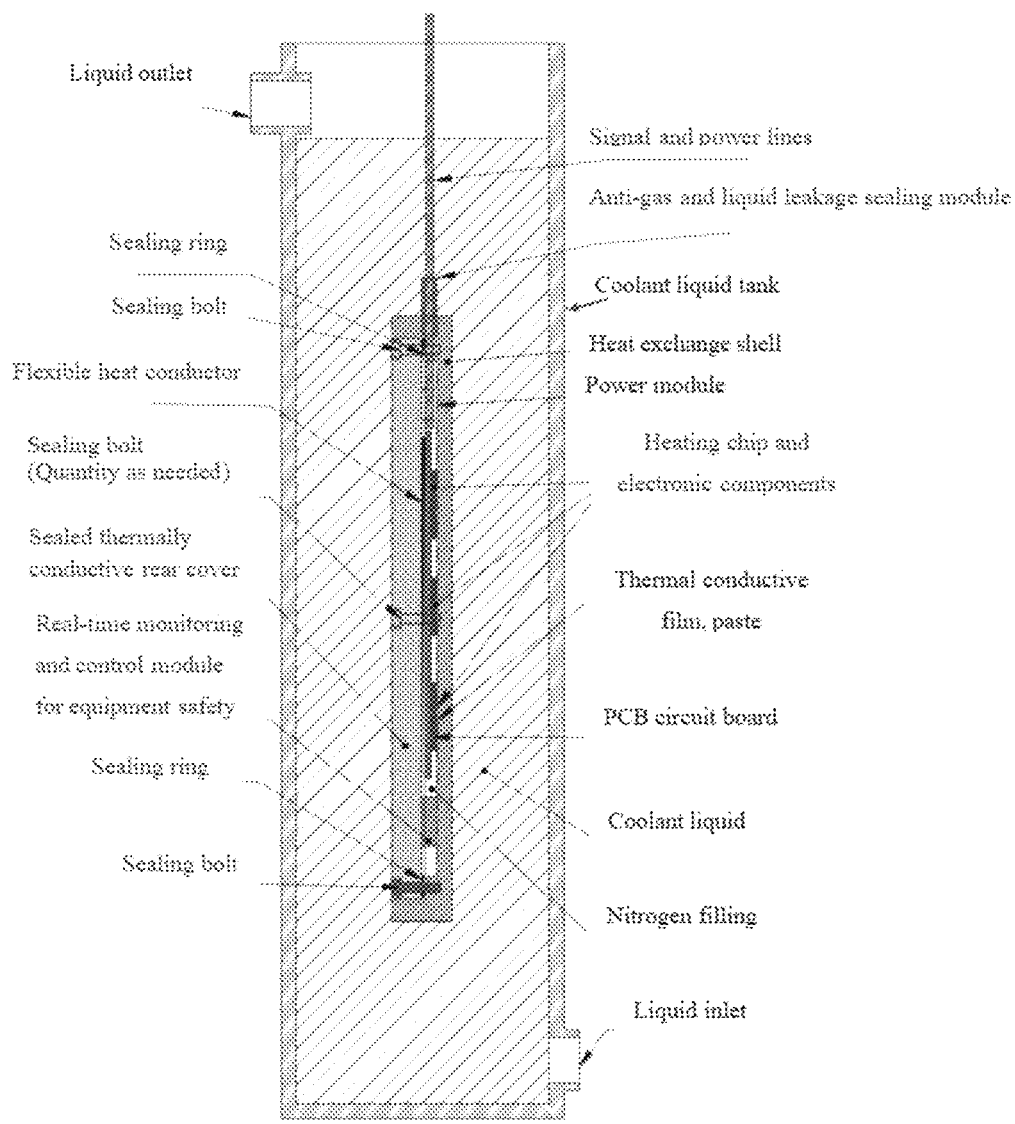
FIG. 63 is a basic schematic diagram of a first principle of the liquid-cooled server system of the present invention.
Figure 64:
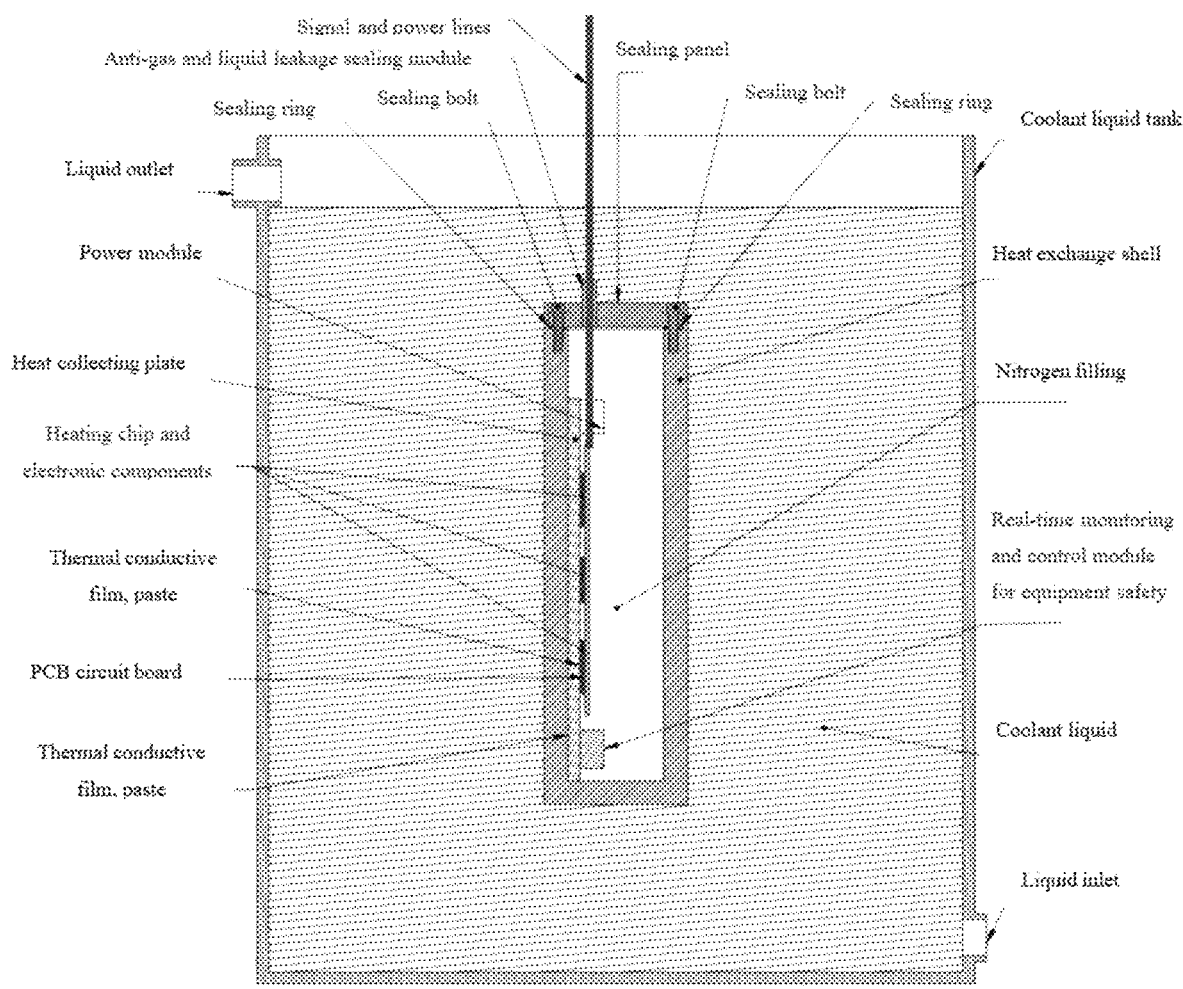
FIG. 64 is a basic schematic diagram of a second principle of the liquid-cooled server system of the present invention.
Figure 65:
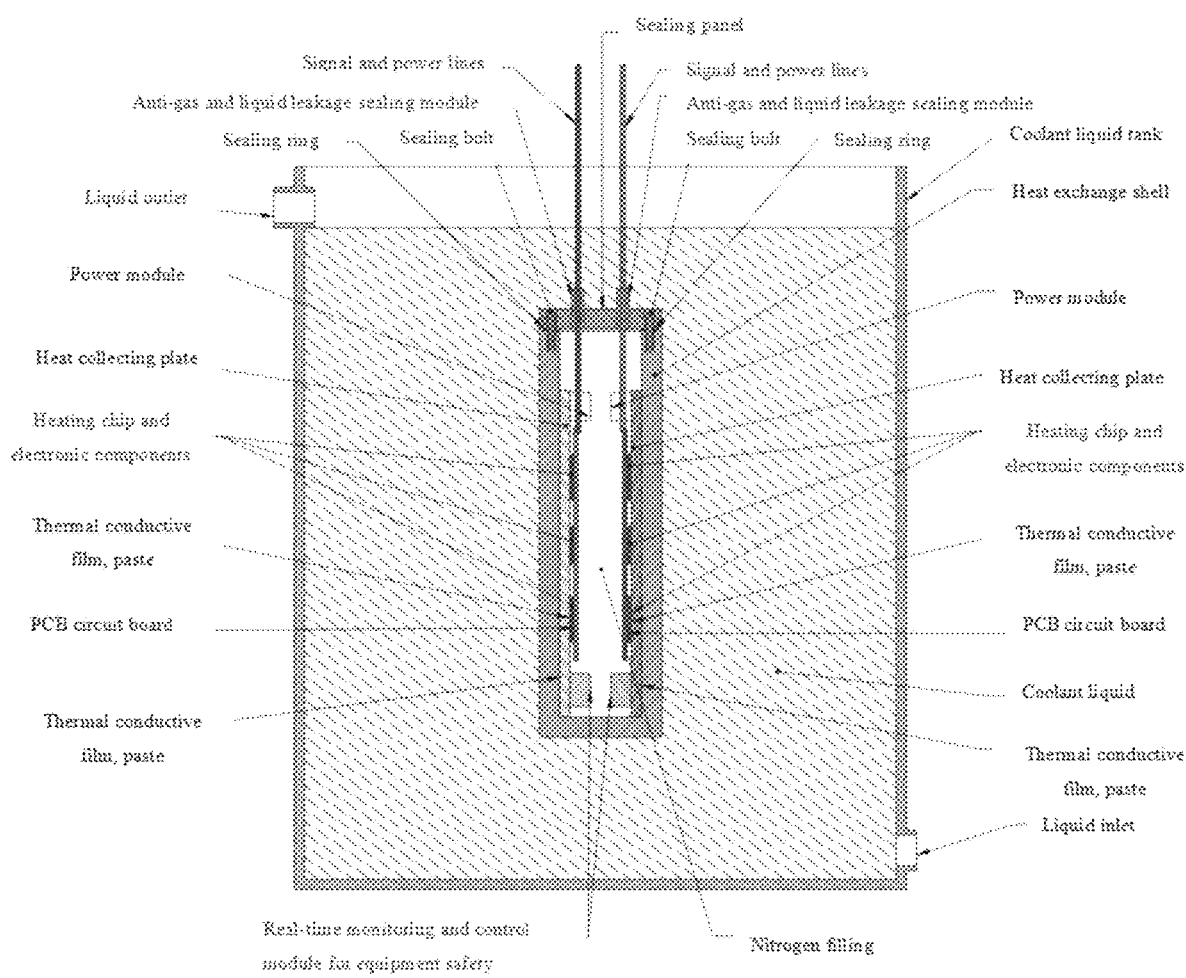
FIG. 65 is a basic schematic diagram of a third principle of the liquid-cooled server system of the present invention.

The principle of the present technical solution is as follows:

FIG. 63 illustrates the first basic schematic diagram of the liquid-cooled server of the present invention. Specifically, it includes a coolant liquid tank with liquid outlet at the upper part and liquid inlet at the lower part, filled with coolant liquid, which may be water. The water-cooled server is placed inside the coolant liquid tank, positioned below the liquid level. This water-cooled server comprises a heat exchange shell and a sealed thermally conductive rear cover. The interior of the server is equipped with a power module, which is sealed and connected to the heat exchange shell through a sealing ring and sealing bolts. A flexible thermal conductor is mounted on the inner wall of the sealed thermally conductive rear cover, where a PCB circuit board is installed. The PCB board is equipped with heating chips and electronic components. The sealed cover is sealed and connected to the heat shell using sealing bolts and sealing rings, with the upper part being sealed using a gas and liquid leak-proof sealing module for signal and power line output. A thermal film or thermal paste is placed between the inner wall of the heat exchange shell, the sealed thermally conductive rear cover, the heating chips, and the electronic components for heat conduction. This allows heat to transfer to the heat exchange shell or thermal rear cover, where it is then exchanged with the external coolant liquid for heat dissipation. The remaining internal space is filled with nitrogen to ensure the stability of the electronic components. Liquid circulation is achieved through the liquid outlet and inlet, maintaining the temperature stability of the coolant liquid. In this technical solution, the heating chip and flexible thermal conductor are set as one unit, with one side directly attached to the heat exchange shell or thermal rear cover using a thermal film, thermal paste, or flexible thermal conductor for conduction, while the other side also conducts heat;

FIG. 64 presents the second basic schematic diagram of the liquid-cooled server. The difference from the first schematic is that it uses a single set of heating chips and electronic components on one side for heat conduction, without conduction on the other side. The internal width and dimensions are larger;

FIG. 65 shows the third basic schematic diagram of the liquid-cooled server is illustrated. The difference from the second schematic is that it uses two sets, with each set of heating chips and electronic components mounted on one side for heat conduction, without conduction on the other side. The sets are spaced apart from each other, and the internal width and dimensions are larger.

Embodiment 1

Referring to FIGS. 1-20, the liquid-cooled server system of the present invention includes a coolant liquid tank structure 1 with a groove-shaped sealed liner and a server 2 immersed below the coolant liquid level liquid 3 inside the coolant liquid tank structure 1. The coolant liquid tank structure 1 is specifically shown in FIG. 1. In this embodiment, the coolant liquid tank structure 1 is rectangular in shape, with a length-to-width-to-height ratio of approximately 1:1.2:1. In this embodiment, water is used as the coolant liquid 3; however, alternative liquid substances producing the same effect should also fall within the protection scope of this technical solution;

As shown in FIGS. 1-15, the coolant liquid tank structure 1 includes a coolant liquid tank lower sealing plate 111 surrounding the outer side of the groove-shaped sealed liner, a coolant liquid tank upper sealing plate 107 located above the coolant liquid tank lower sealing plate 111, an adjustable power signal line bridge 104 mounted on a positioning frame rib 106 on the top beam of the groove-shaped sealed liner, a server positioning frame 105 located on both sides of the positioning frame rib 106, coolant liquid monitoring device at the bottom of the server positioning frame 105, coolant liquid inlet structure on one side of the coolant liquid tank structure 1, coolant liquid outlet structure on the other side, and a coolant liquid tank operation controller located on the side of the coolant liquid tank lower sealing plate 111. The bottom of the coolant liquid tank structure 1 is equipped with coolant liquid tank support legs 110, which serve to elevate the coolant liquid tank structure 1;

The lower sealing plate 111 of the coolant liquid tank is detachably connected to the mounting hook 1111 of the side sealing plate and the mounting hole 1112 of the sealing plate on the vertical beam at the corner position of the groove-shaped sealed liner. Additionally, the vertical beam is also equipped with cable routing grooves 108. This detachable connection facilitates maintenance and repair while maintaining an aesthetically pleasing overall appearance. The cable routing groove 108 allows for convenient cable management, avoiding the issue of tangled cables;

The power signal line bridge 104 adopts a gantry structure, with its bottom engaging with the top beam of the groove-shaped sealed liner through an inverted concave structure 103. The server positioning frame 105 is connected to the positioning frame rib 106 using a connecting plate with positioning holes and positioning frame bolts 1061. The gantry structure of the power signal line bridge 104 is beneficial for organizing and positioning the terminal and cables at the wiring output end on the top of the installed server 2, ensuring stable output and connection. The server positioning frame 105, which is located on the power signal line bridge 104, facilitates position and cable routing coordination. The positioning frame bolts 1061 and positioning frame rib 106 allow for position and distance adjustments based on different sizes and models of servers, offering good versatility and applicability;

The upper beam of the power signal line bridge 104 is equipped with a PDU power interface 1041, which is covered by a cover plate 1042. Both sides of the upper beam have wire exit holes 10411. The PDU power interface 1041 provides power to the server 2 and is surface-protected by the cover plate 1042

On both sides of the server positioning frame 105, several server positioning grooves 1052 are arranged with server positioning connection screws 1053, each featuring a T-handle 1051 on the top. The number and position of the T-handles 1051 on the server positioning connection screws 1053 match those of the server positioning grooves 1052;

The bottom of the server positioning frame 105 is equipped with a sensor mounting beam 1054, which is installed with coolant liquid monitoring devices via sensor mounting bolt 1056. The coolant liquid monitoring devices include high-level temperature sensor 1057, mid-level temperature sensor 1059, low-level temperature sensor 1058, and liquid level sensor 1060. The high-level, mid-level, and low-level temperature sensors 1057, 1059, and 1058 detect the temperature at different heights in the coolant liquid 3, providing real-time safety detection. If the temperature exceeds a set threshold, an alarm is triggered. The liquid level sensor 1060 detects the coolant liquid level liquid 3, and alerts if the liquid level is either too high or low;

The coolant liquid inlet structure includes an feed chamber 101, several inlet branch pipes 1011 connected to the upper part of the feed chamber 101, and a main feed pipe 1012 connected to the inlet branch pipes 1011. The main feed pipe 1012 is fixed by a valve pipe positioning clamp 1017, with the input end equipped with a main inlet solenoid valve 1018, an inlet flow sensor 1015, and a manual main valve 1019. The feed chamber 101 is connected to the groove-shaped sealed liner via an inlet hole 1016. The manual main valve 1019 provides manual control, the main inlet solenoid valve 1018 controls automatic inlet switching, and the inlet flow sensor 1015 monitors flow data. The valve pipe positioning clamp 1017 secures the main feed pipe 1012 and the corresponding valves or main control components. The coolant liquid 3 flows through the inlet branch pipes 1011 and the inlet hole 1016 into the interior of the groove-shaped sealed liner of the coolant liquid tank structure 1;

The coolant liquid outlet structure includes a drainage overflow chamber 102, several drainage overflow branch pipes 1021 connected to the bottom of the drainage overflow chamber 102, and a drain pipe 10141 connected to the drainage overflow branch pipes 1021. A drainage flow sensor 1014 and an electromagnetic drainage valve 1022 are installed on the drain pipe 10141. The surface of the top beam of the groove-shaped sealed liner on the side of the drainage overflow chamber 102 is equipped with a drainage overflow hole 1071 that communicates with the drainage overflow chamber 102. The drainage flow sensor 1014 monitors drainage flow data, while the electromagnetic drainage valve 1022 controls automatic drainage switching. The coolant liquid 3 is drained via the drainage overflow hole 1071, passing through the drainage overflow chamber 102, drainage overflow branch pipes 1021, and ultimately being discharged via the drain pipe 10141. During the inlet and outlet processes, liquid level transmitters 1013 monitor the levels, and the coolant liquid tank operation controller regulates the process The coolant liquid tank operation controller includes a controller 109, which is electrically connected to the liquid level transmitter 1013, a switch 1094, a power circuit breaker 1095, an emergency stop switch 1093, a forced liquid supply button 1091, and a forced drainage button 1092. The power circuit breaker 1095 is installed on the back of an opening in the lower sealing plate 111 of the coolant liquid tank via a DIN rail 1096, fixed and sealed by a power compartment cover 1097 and cover bolts 1098. The emergency stop switch 1093 is used for emergency braking, the power circuit breaker 1095 switches the power supply of electrical devices, and the switch 1094 enables data exchange. The controller 109 manages overall control, using a PLC controller. Forced liquid supply or drainage actions can be triggered via the forced liquid supply button 1091 and forced drainage button 1092.

As shown in FIGS. 16-19, the servers 2 are suspended on the server positioning frame 105 and arranged in an array within the coolant tank structure 1. The bottom of each server 2 is immersed in the coolant 3, with the wiring output terminals of the servers positioned at the top. The servers 2 have a flat box-shaped structure, comprising a sealed heat dissipating finned housing 202, a sealed cover 203 with handle positioning grips 2032 on both sides of the top, and internal electrical components and devices of the server 2. The servers 2 achieve positioning and suspension through cooperative engagement among the T-shaped alignment channels 201 on the sides, the handle positioning grips 2032, and the server positioning frame 105.

Figure 16:
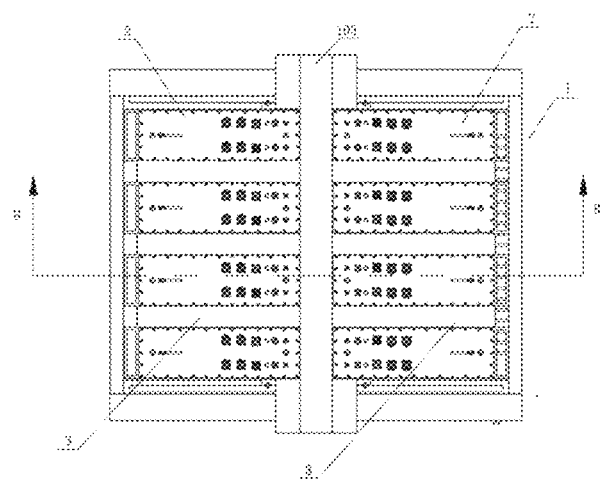
FIG. 16 is a top view of a specific embodiment of the coolant tank structure with an installed server.
Figure 17:
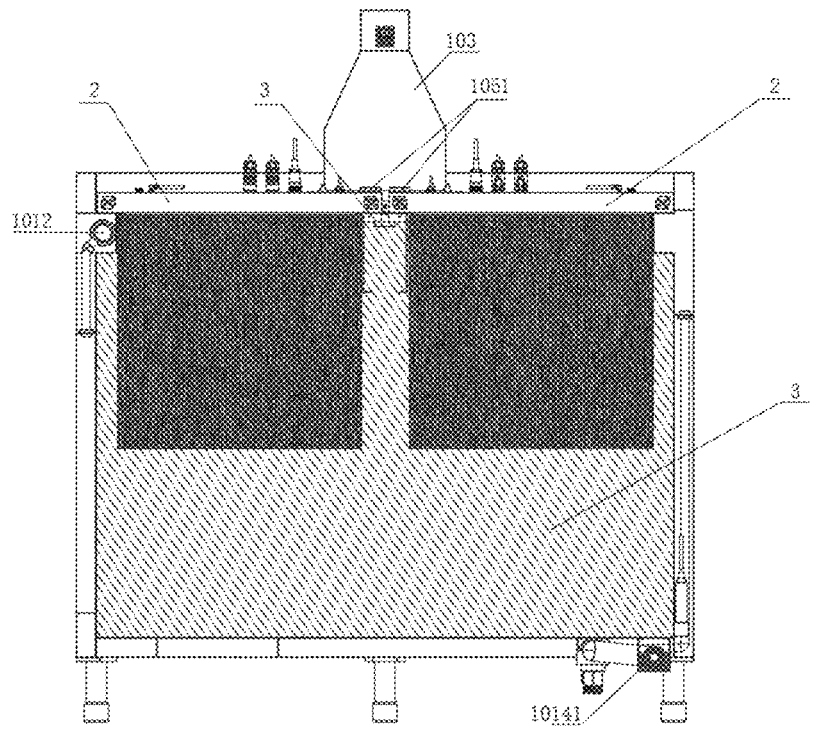
FIG. 17 is a cross-sectional view taken along line H-H of FIG. 16.

FIGS. 16-17 detail a suspension connection method for the server 2. In this embodiment, four servers 2 are suspended on each side of the server positioning frame 105. At this arrangement, the gaps between the sides of each server 2 are relatively large, and the width of each server 2 is relatively wide.

Figure 18:
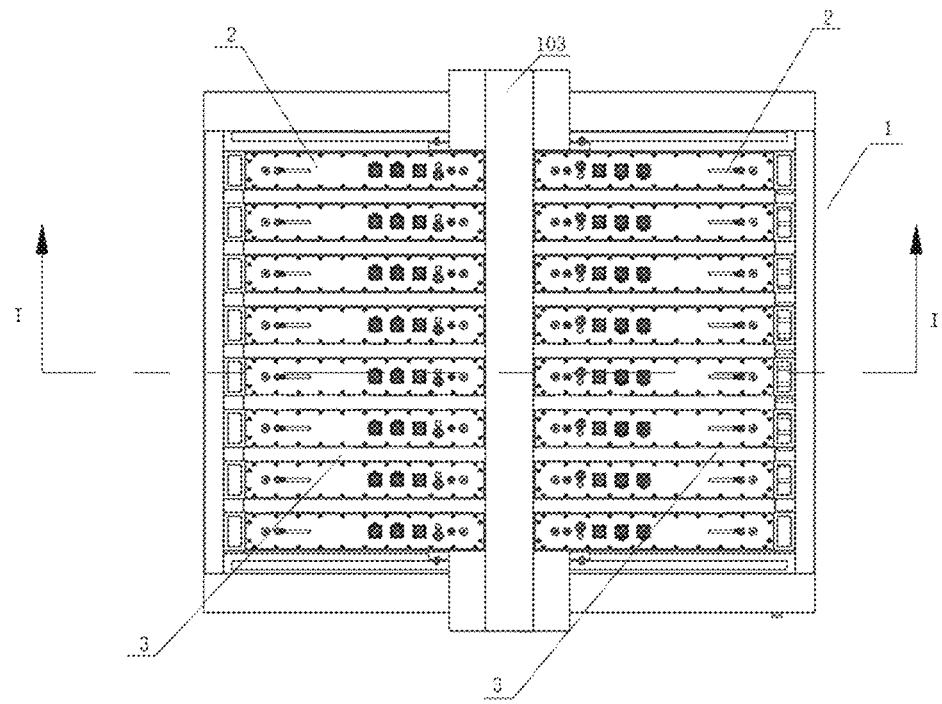
FIG. 18 is a top view of another specific embodiment of the coolant tank structure with an installed server.
Figure 19:
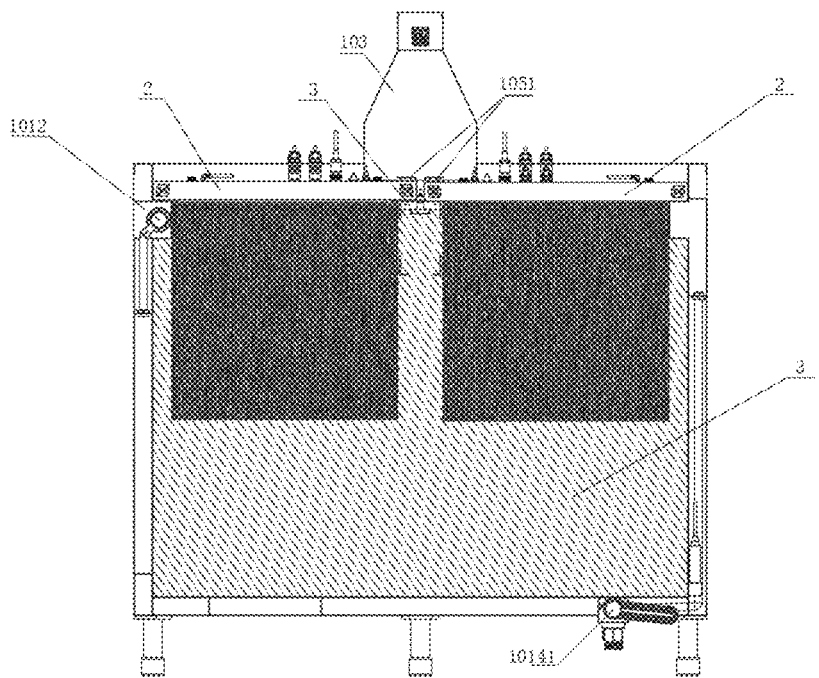
FIG. 19 is a cross-sectional view taken along line I-I of FIG. 18.

FIGS. 18-19 display another suspension connection method for the server 2. In this embodiment, eight servers 2 are suspended on each side of the server positioning frame 105. The gaps between the sides of each server 2 are smaller, and the width of each server 2 is smaller.

Figure 20:
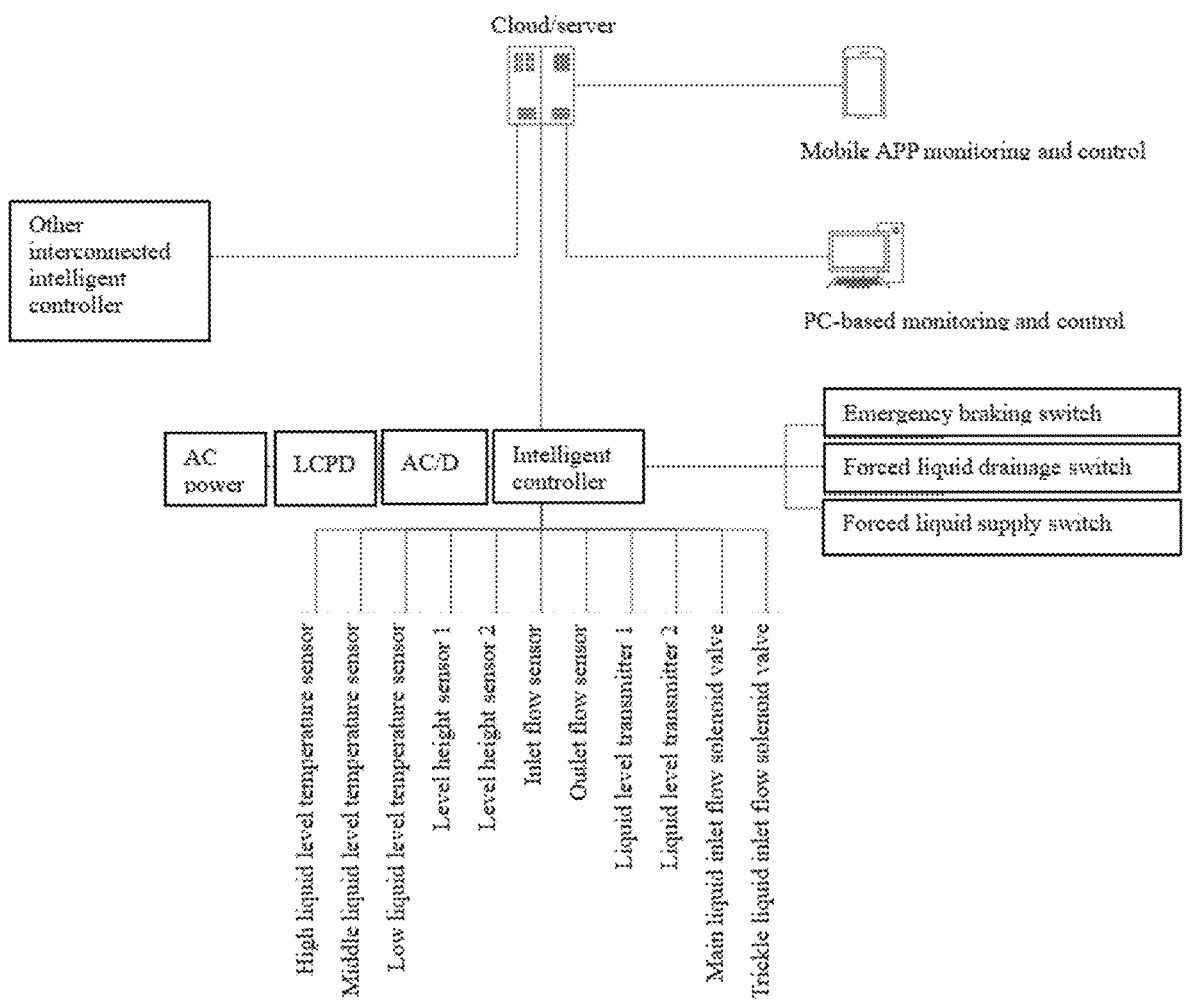
FIG. 20 is a system control principle framework diagram of a liquid-cooled server system according to the present invention.
Figure 21:
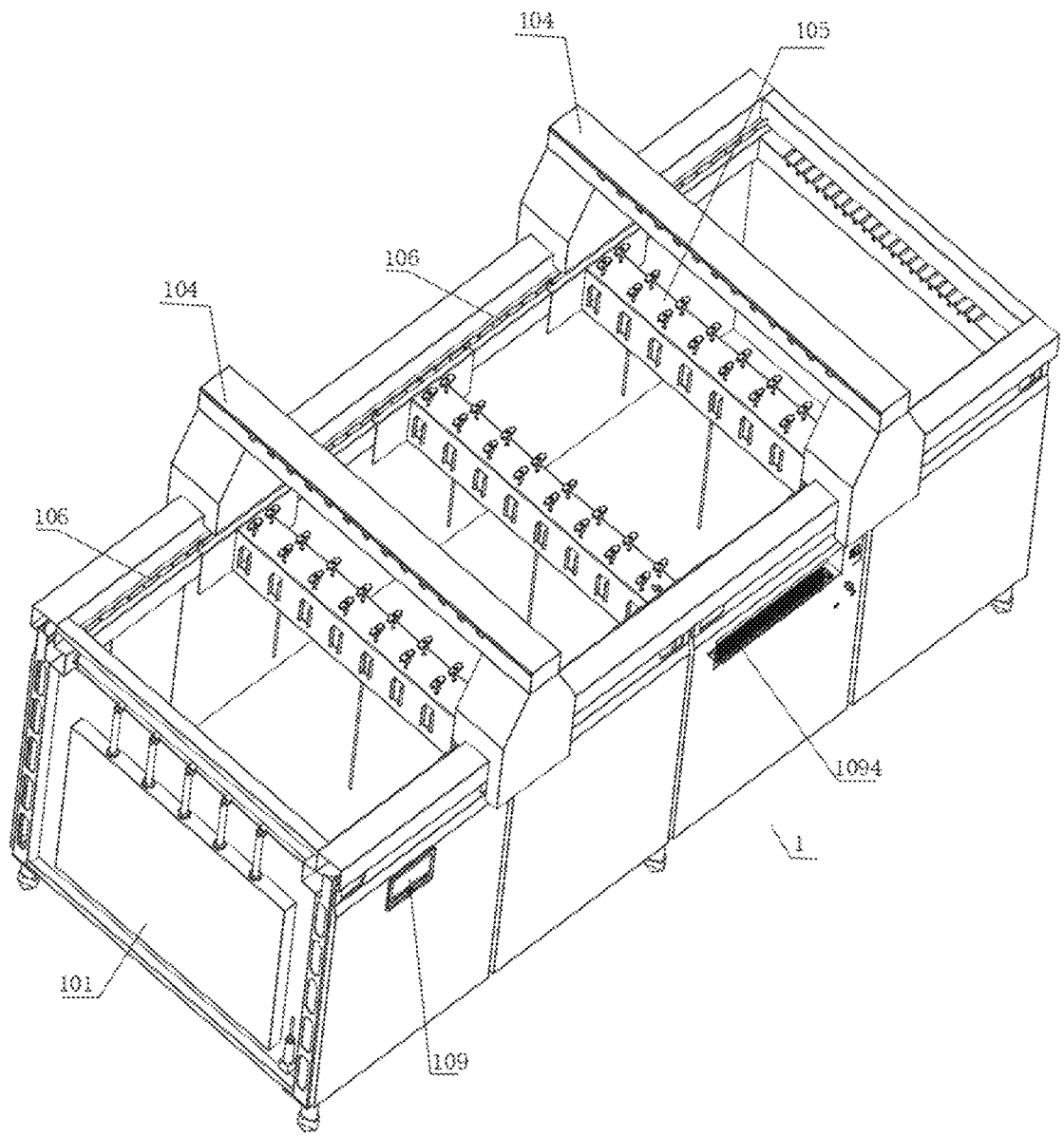
FIG. 21 is a schematic diagram of the coolant tank structure in a liquid-cooled server system according to the Embodiment 2.
Figure 22:
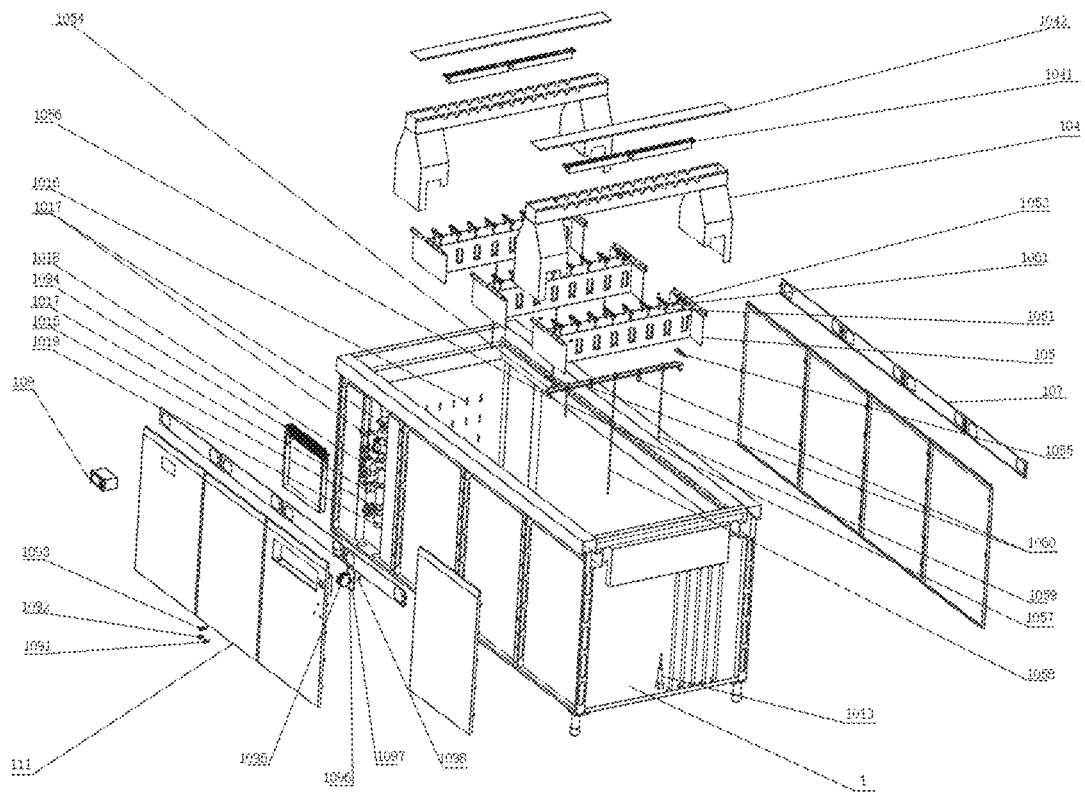
FIG. 22 is an exploded view of the structure shown in FIG. 21.

FIG. 20 shows the control principle schematic diagram of the corresponding system. The servers are used in a liquid cooling scenario for cloud servers, with monitoring and control available through a mobile app, PC, or other intelligent control terminals. The server is controlled by an intelligent controller, which connects to the emergency brake switch, forced drainage switch, forced liquid supply switch, high liquid level temperature sensor, middle liquid level temperature sensor, low liquid level temperature sensor, liquid level sensor 1, liquid level sensor 2, liquid inlet flow sensor, liquid discharge flow sensor, liquid level transmitter 1, liquid level transmitter 2, main liquid inlet flow solenoid valve, and trickle liquid inlet flow solenoid valve. This intelligent controller is connected to an AC power source via an AC/DC module, circuit breaker, and leakage protector.

Embodiment 2

As shown in FIGS. 21-26, this embodiment differs from the Embodiment 1 in that the coolant tank structure 1 is rectangular, with a length-to-width-to-height ratio of approximately 4:1.1. It is provided with three server positioning frames 105 and two power signal bridges 104. The server positioning frames 105 are evenly spaced within the coolant tank structure 1, providing four spaces for suspending the servers 2. The second server positioning frame 105 is located centrally, positioned between the two power signal bridges 104, while the first and third server positioning frames 105 are positioned directly below the two power signal bridges 104. Other structural elements are consistent with those in the Embodiment 1.

Figure 23:
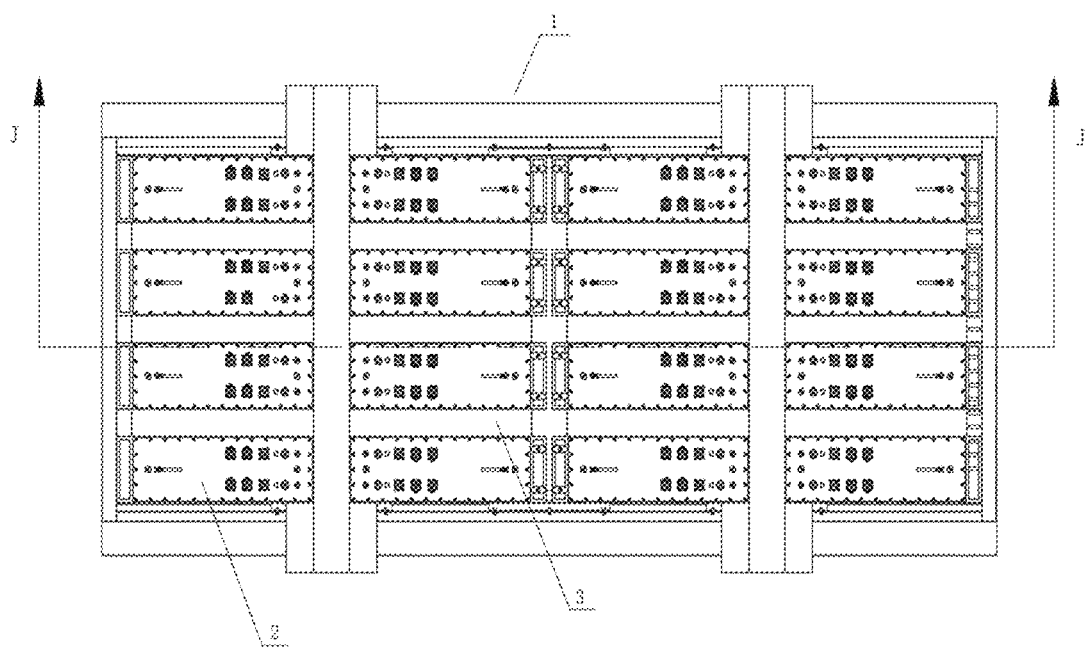
FIG. 23 is a top view of a specific embodiment of the coolant tank structure with an installed server shown in FIG. 21.
Figure 24:
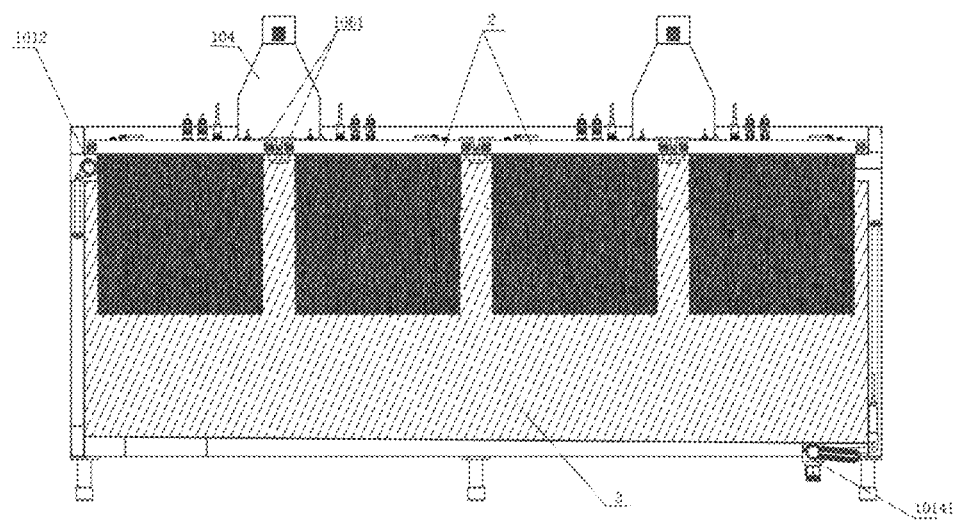
FIG. 24 is a cross-sectional view taken along line J-J of FIG. 23.

FIGS. 23-24 set forth a suspension connection method for the server 2. In this embodiment, four servers 2 are suspended on each side of the server positioning frame 105, resulting in larger gaps between the sides of the servers 2 and a wider size for each server 2. A total of sixteen servers 2 are suspended in this embodiment.

Figure 25:
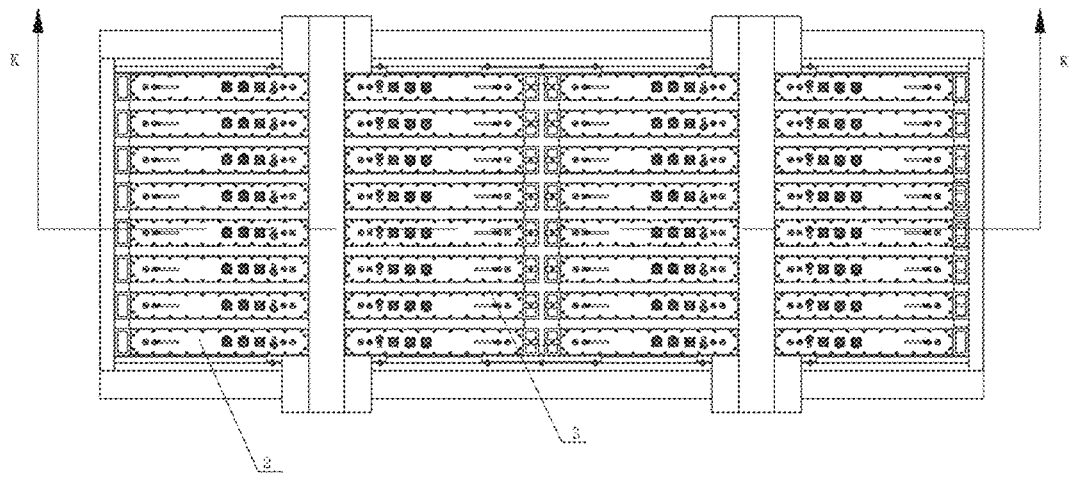
FIG. 25 is a top view of another specific embodiment of the coolant tank structure with an installed server shown in FIG. 21.
Figure 26:
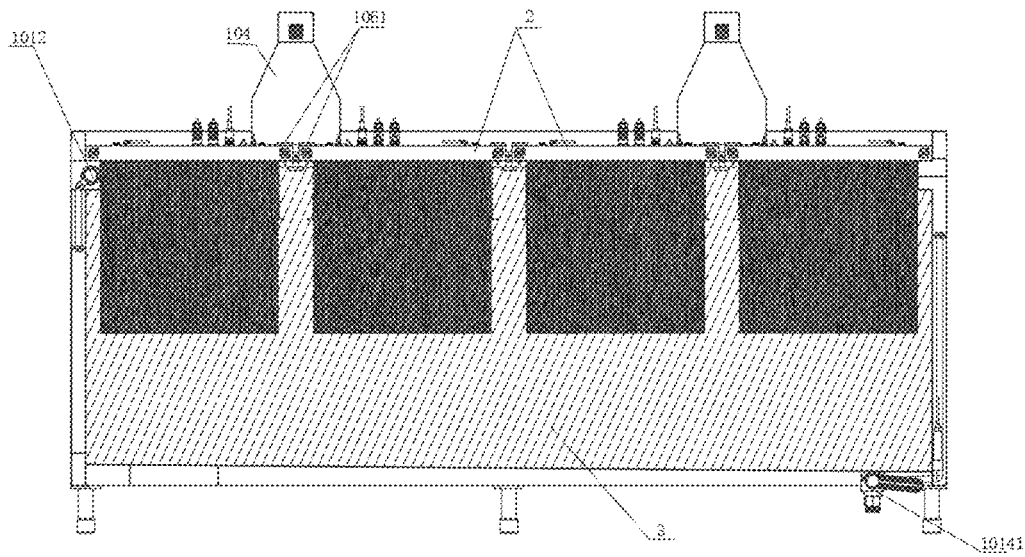
FIG. 26 is a cross-sectional view taken along line K-K of FIG. 25.
Figure 27:
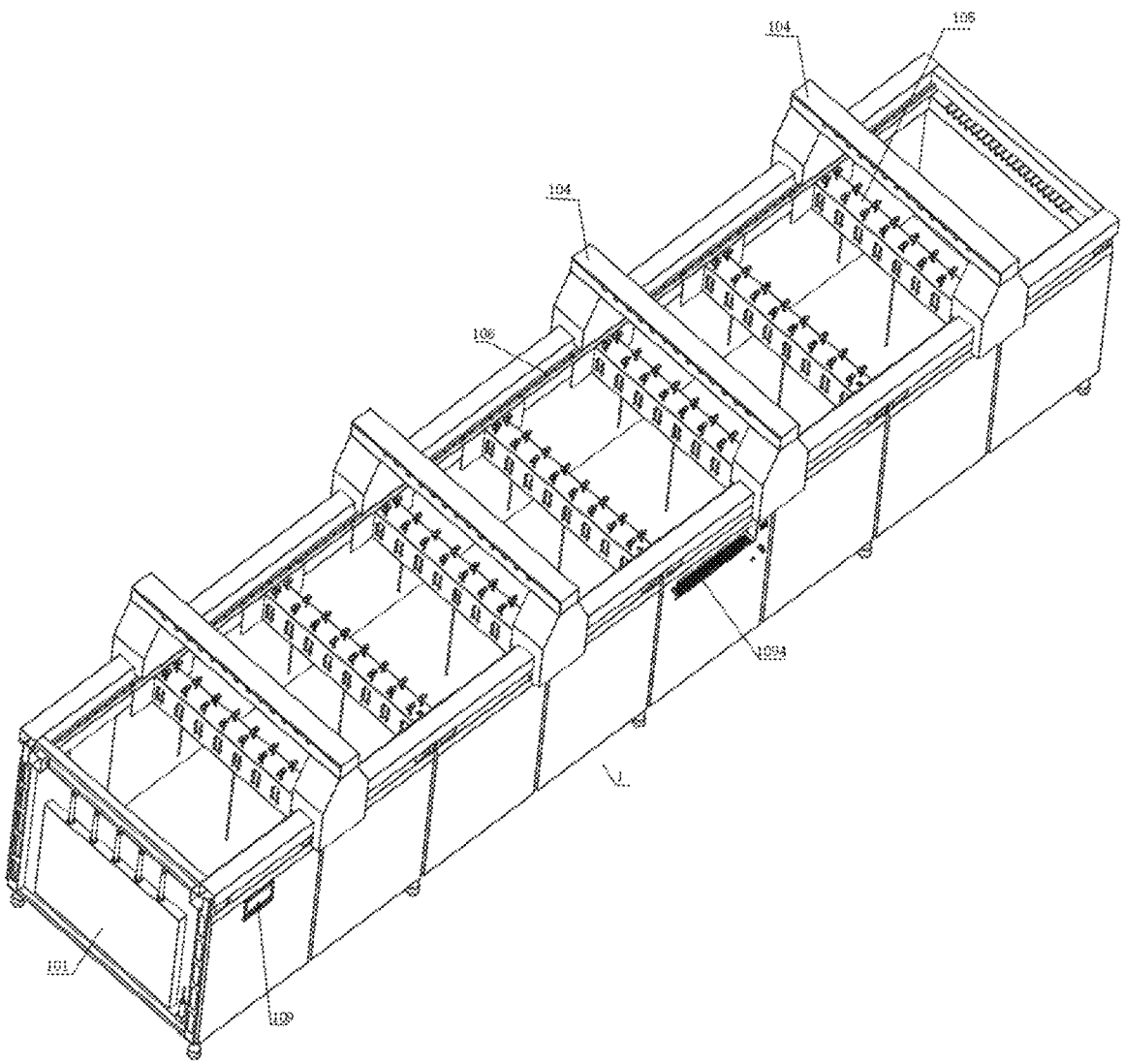
FIG. 27 is a schematic diagram of the coolant tank structure in a liquid-cooled server system according to the Embodiment 3.
Figure 28:
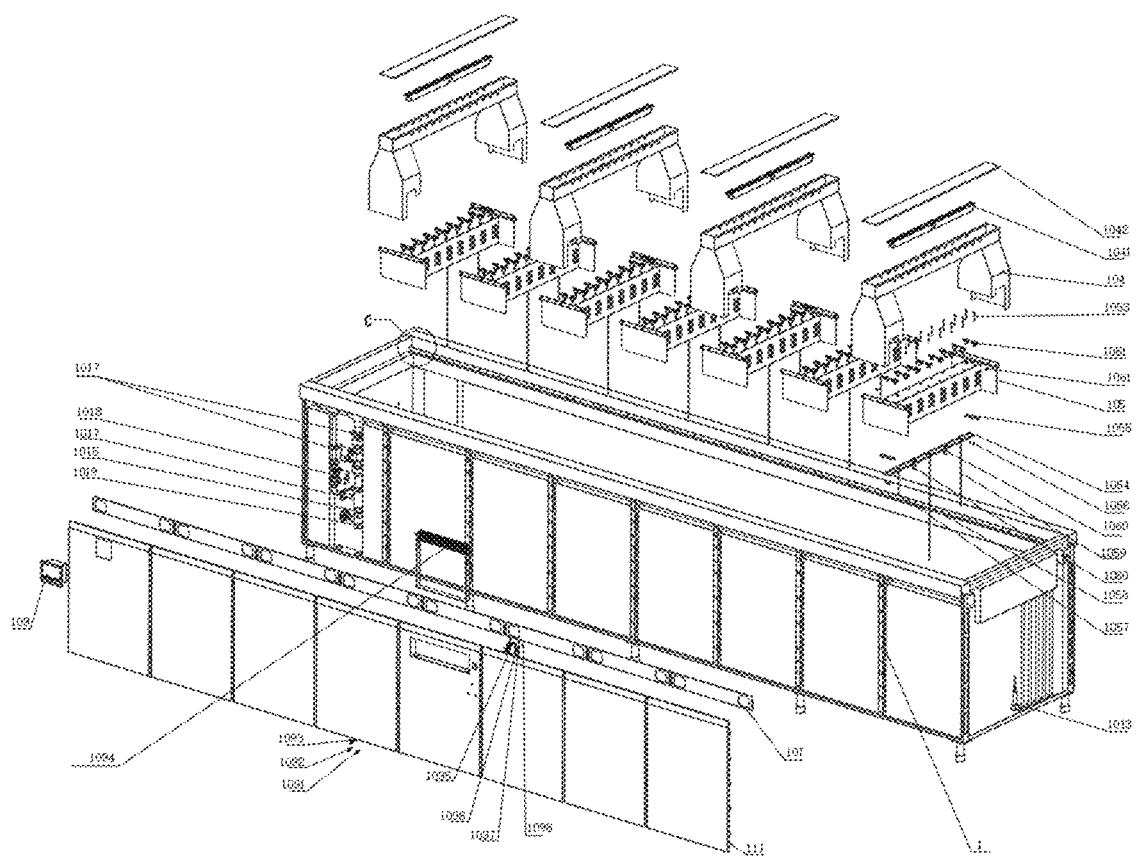
FIG. 28 is an exploded view of the structure shown in FIG. 27.
Figure 29:
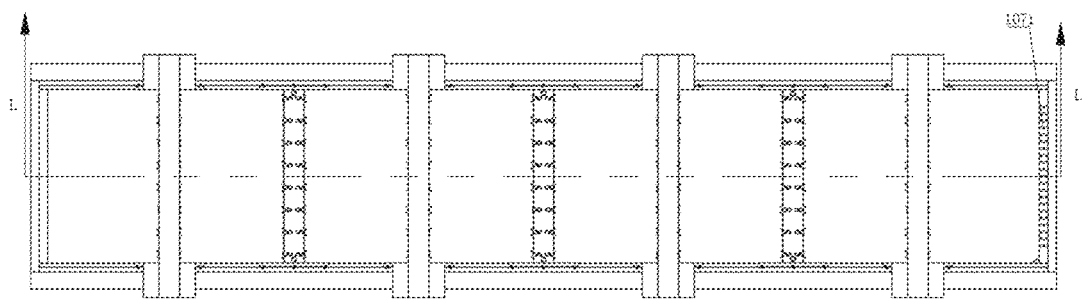
FIG. 29 is a top view of the structure shown in FIG. 27.
Figure 30:
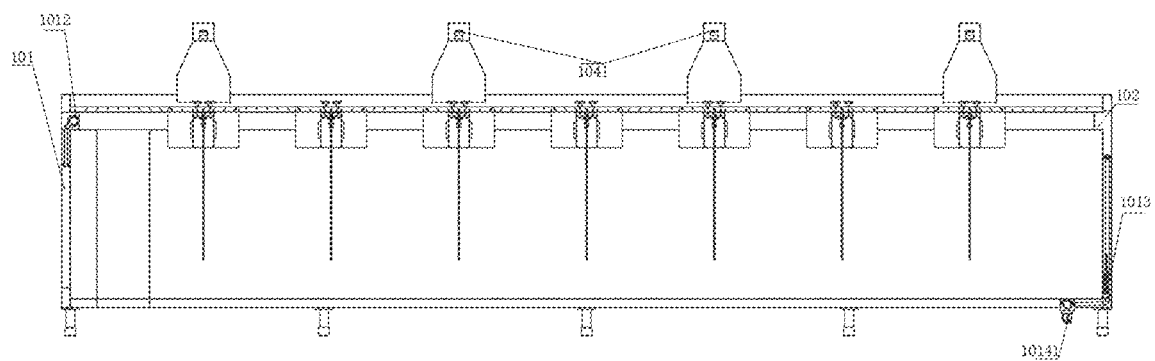
FIG. 30 is a cross-sectional view taken along line L-L of FIG. 29.

FIGS. 25-26 show another suspension connection method for the server 2. In this embodiment, eight servers 2 are suspended on each side of the server positioning frame 105, resulting in smaller gaps between the sides of the servers 2 and a smaller width for each server 2. A total of thirty-two servers 2 are suspended in this embodiment.

Embodiment 3

As shown in FIGS. 27-34, this embodiment differs from the Embodiment 2 in that the coolant tank structure 1 is rectangular, with a length-to-width-to-height ratio of approximately 8:1.1. Three server positioning frame 105 are equipped, and four power signal bridges 104 are arranged at equal intervals. The server positioning frames 105 are evenly distributed within the coolant tank structure 1, providing eight spaces for suspending the servers 2, with the specific configuration shown in FIGS. 27-30.

Figure 31:
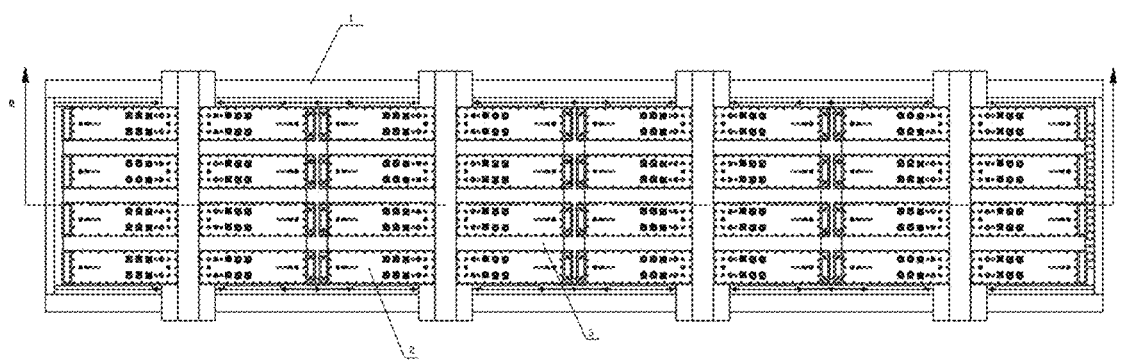
FIG. 31 is a top view of a specific embodiment of the coolant tank structure with an installed server shown in FIG. 27.
Figure 32:
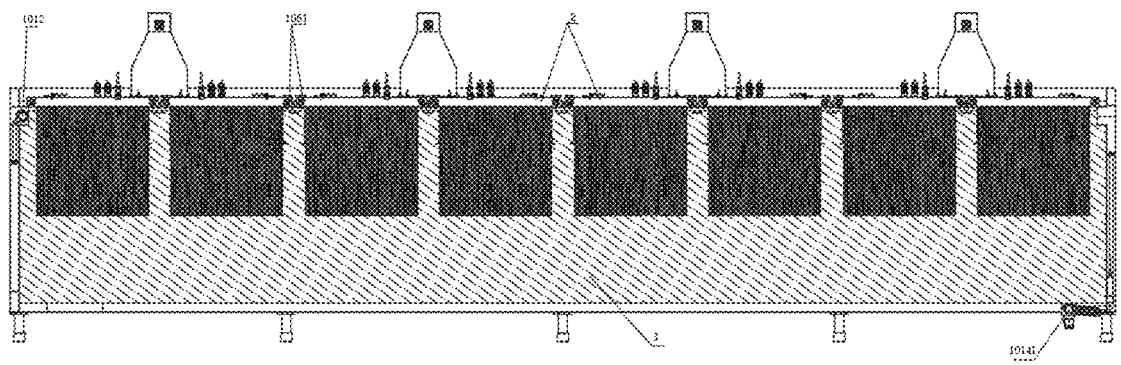
FIG. 32 is a cross-sectional view taken along line M-M of FIG. 31.

FIGS. 31-32 illustrate a suspension connection method for the server 2. In this embodiment, four servers 2 are suspended on each side of the server positioning frame 105, resulting in relatively large gaps between the sides of each server 2 and a wider size for each server 2. A total of thirty-two servers 2 are suspended in this embodiment.

Figure 33:
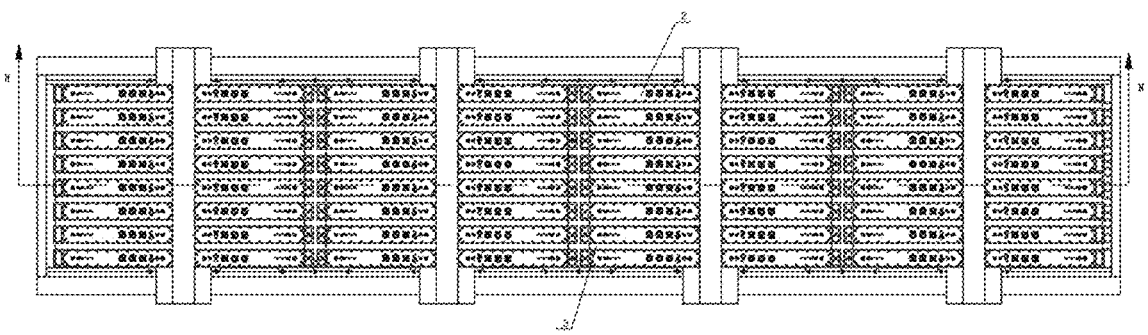
FIG. 33 is a top view of another specific embodiment of the coolant tank structure with an installed server shown in FIG. 27.
Figure 34:
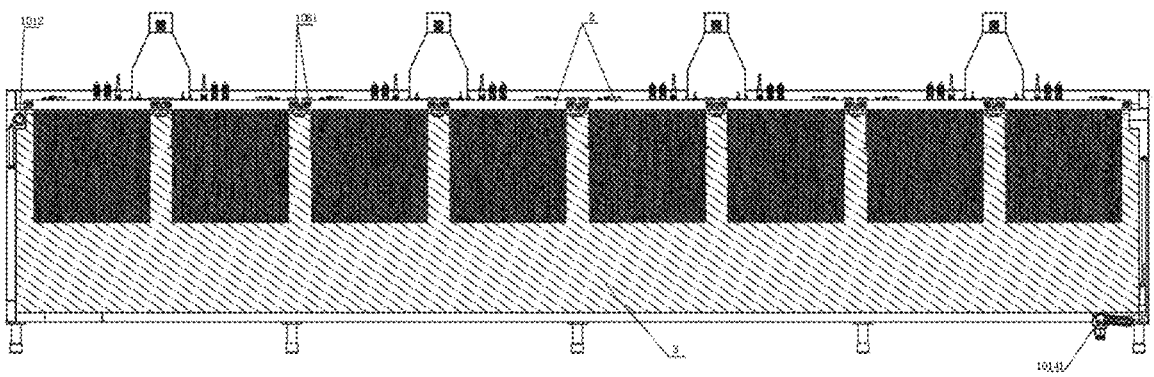
FIG. 34 is a cross-sectional view taken along line N-N of FIG. 33.
Figures 35, 36:
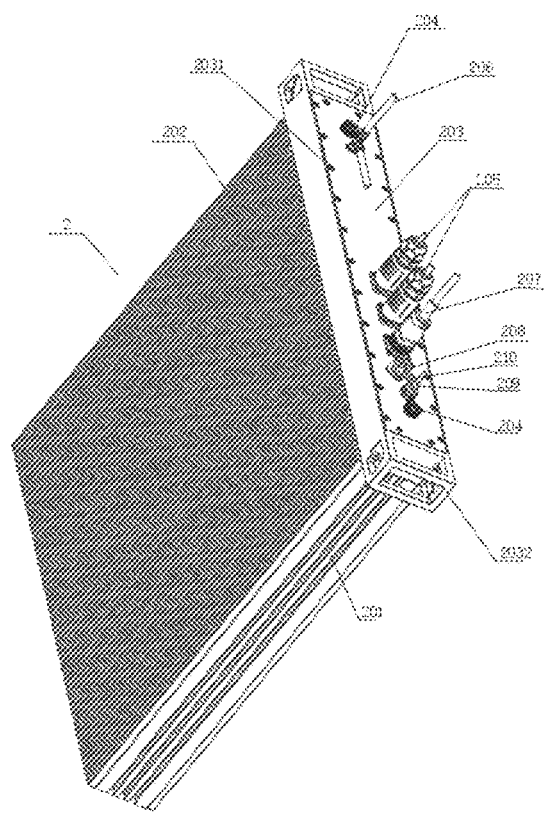
FIG. 35 is a schematic diagram of the server structure in a liquid-cooled server system according to the Embodiment 4 of the present invention.
FIG. 36 is an exploded view of the structure shown in FIG. 35.
Figure 37:
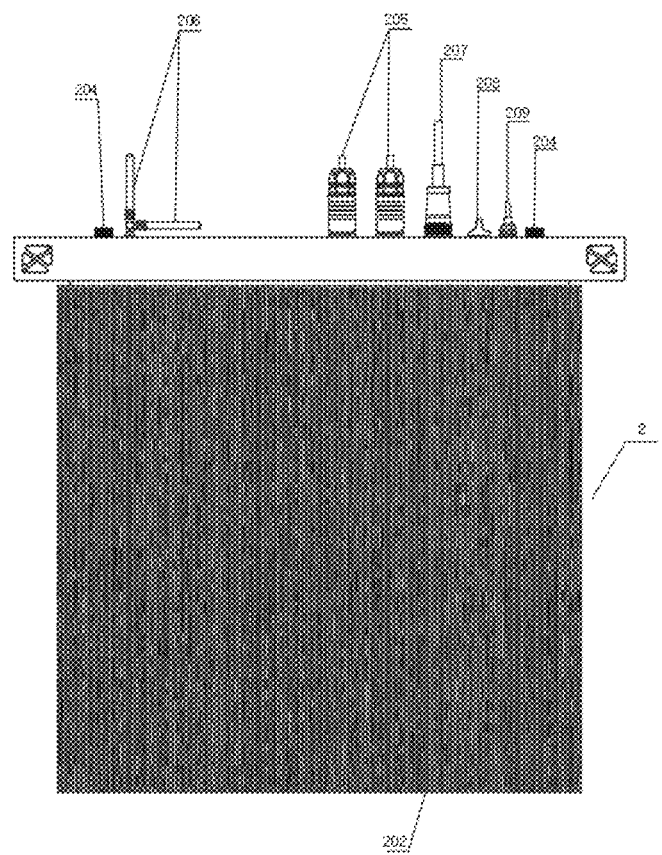
FIG. 37 is a front view of the structure shown in FIG. 35.
Figure 38:
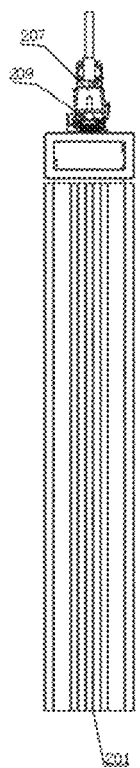
FIG. 38 is a left side view of the structure shown in FIG. 35.
Figure 39:
FIG. 39 is a bottom-up view of the structure shown in FIG. 35.
Figure 40:
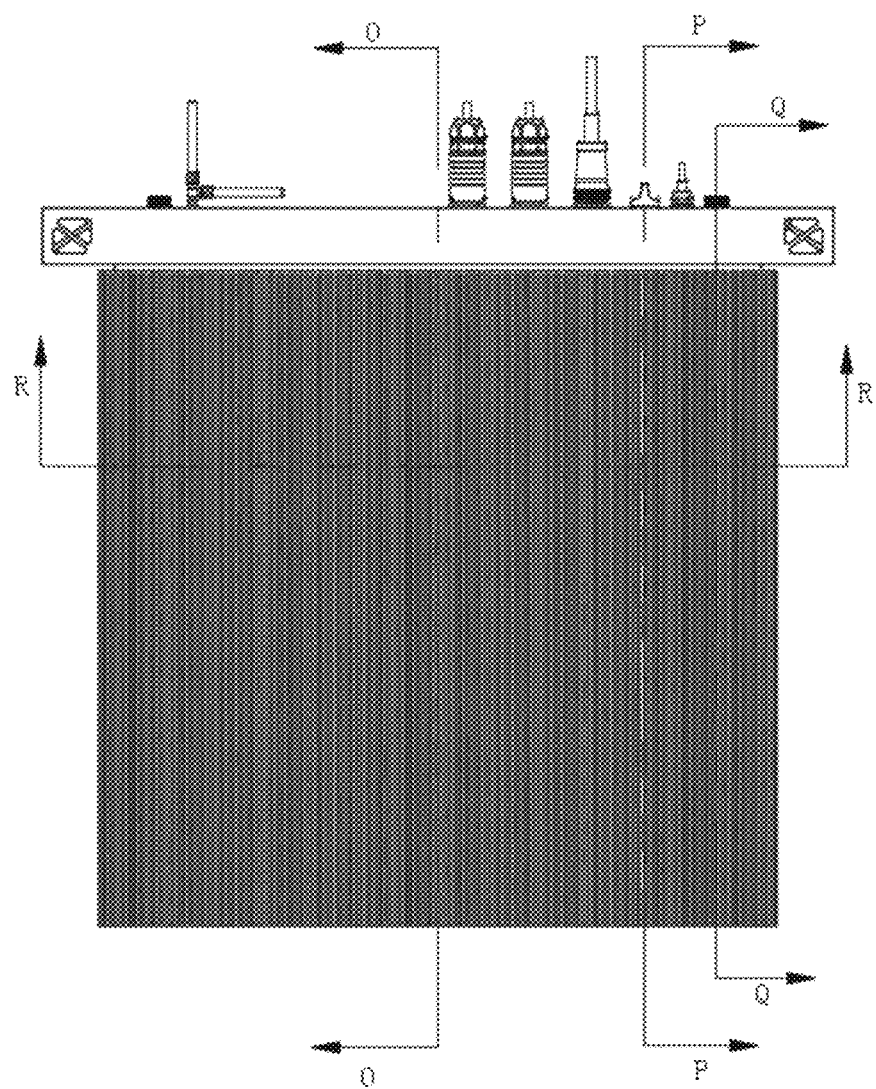
FIG. 40 is a diagram showing the sectional lines of FIG. 35.
Figure 41:
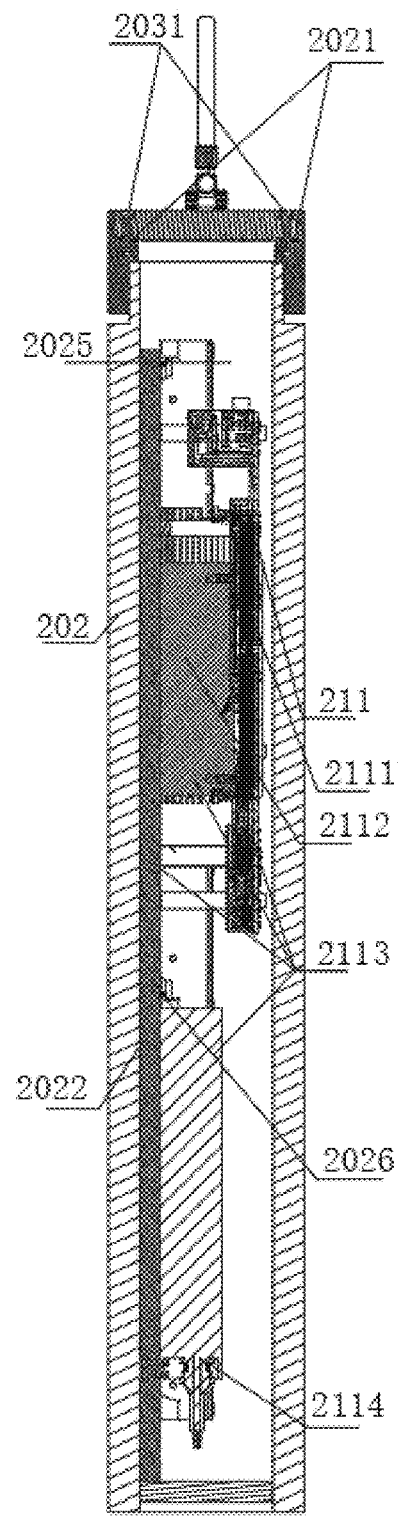
FIG. 41 is a sectional view taken along line O-O of FIG. 40.
Figure 42:
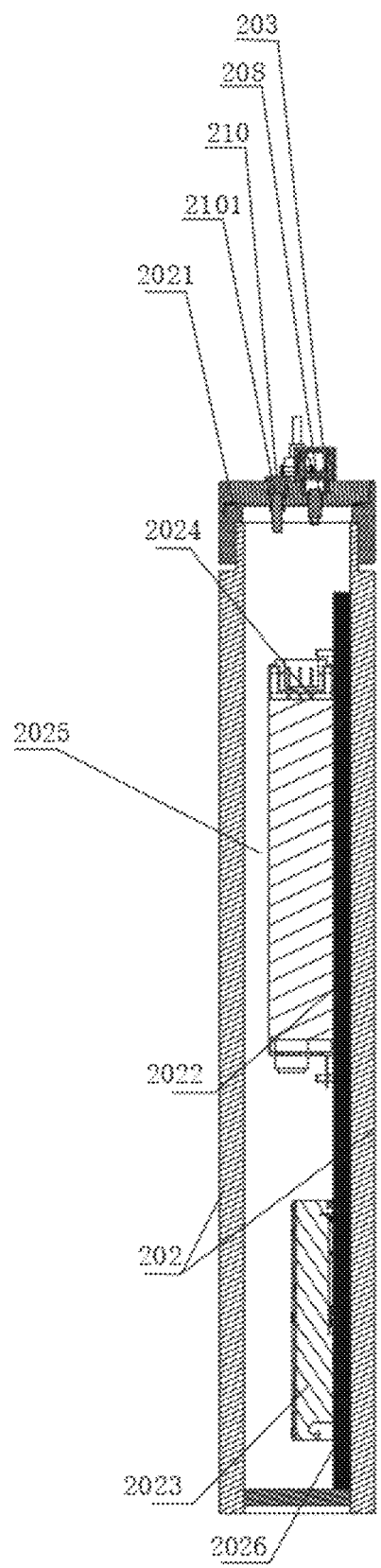
FIG. 42 is a sectional view taken along line P-P of FIG. 40.
Figure 43:
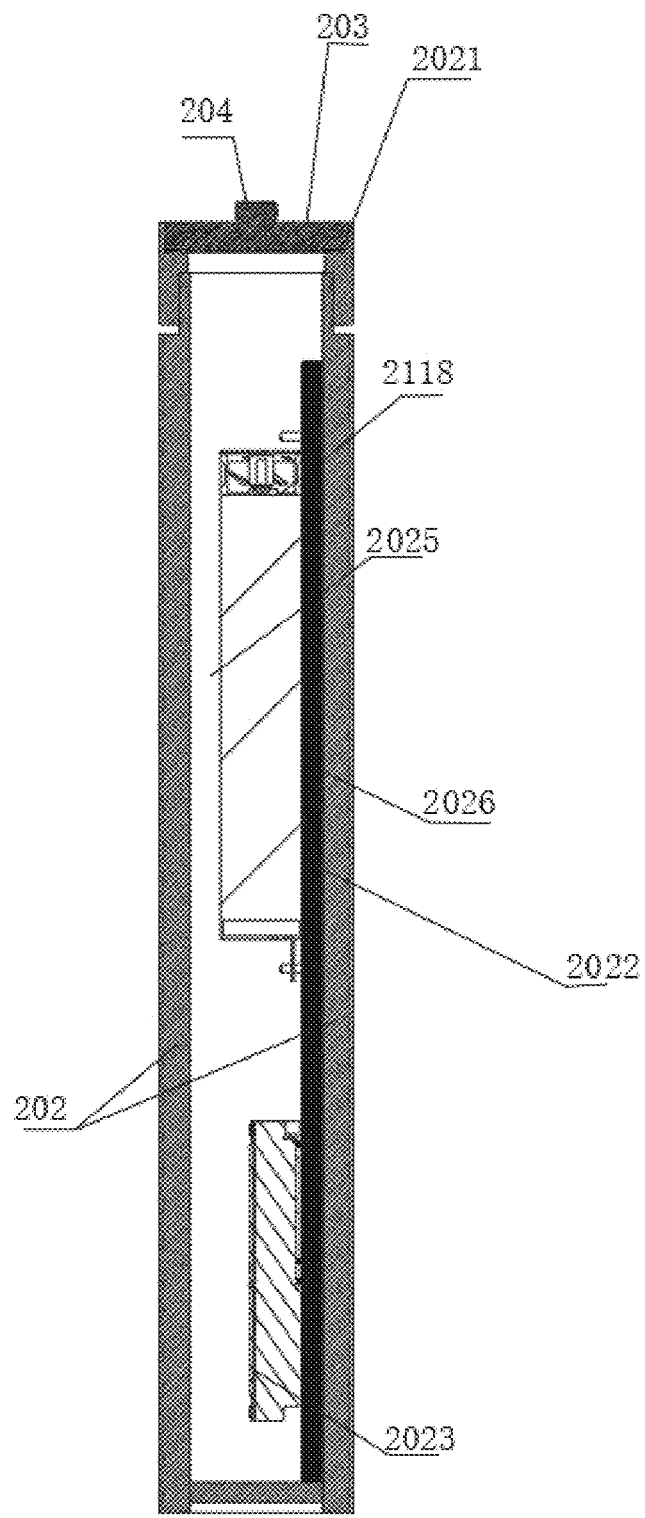
FIG. 43 is a sectional view taken along line Q-Q of FIG. 40.
Figure 44:
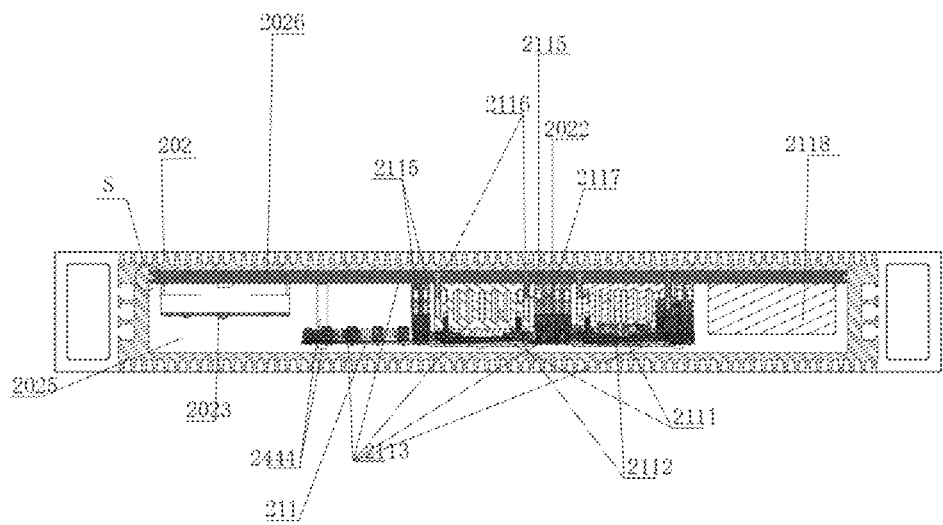
FIG. 44 is a sectional view taken along line R-R of FIG. 40.
Figure 45:
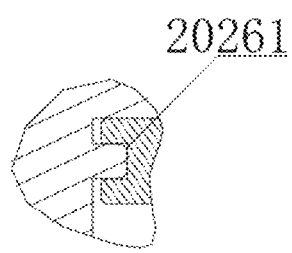
FIG. 45 is a magnified partial view of the structure at position S shown in FIG. 44.
Figure 46:
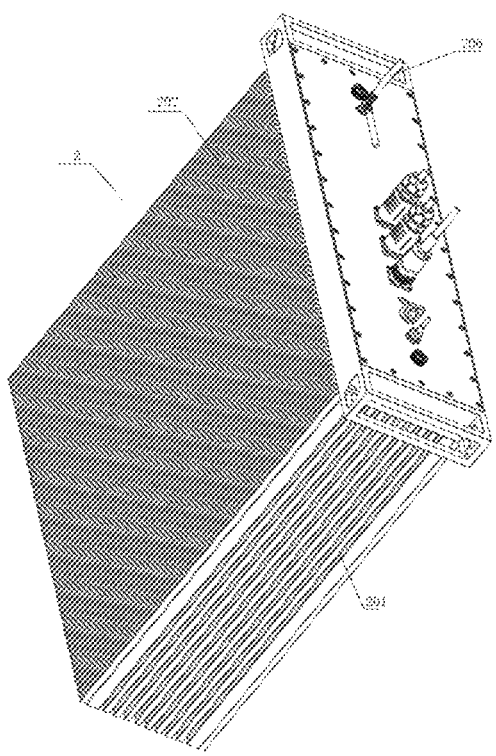
FIG. 46 is a schematic diagram of the server structure in a liquid-cooled server system according to the Embodiment 5 of the present invention.
Figure 47:
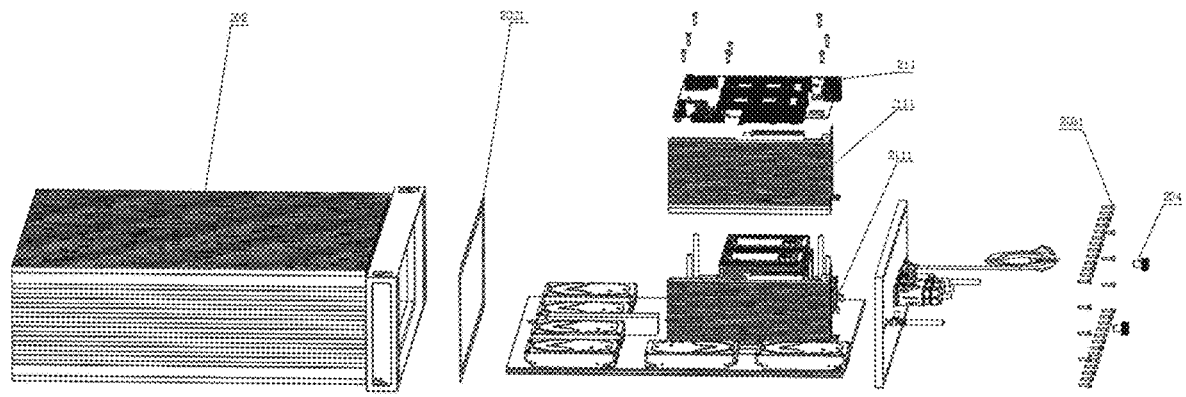
FIG. 47 is an exploded view of the structure shown in FIG. 46.
Figure 48:
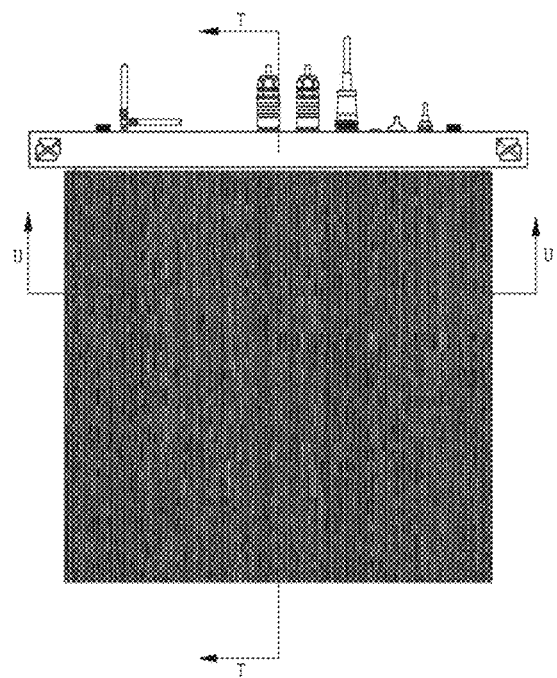
FIG. 48 is a front view of the structure shown in FIG. 46.
Figure 49:
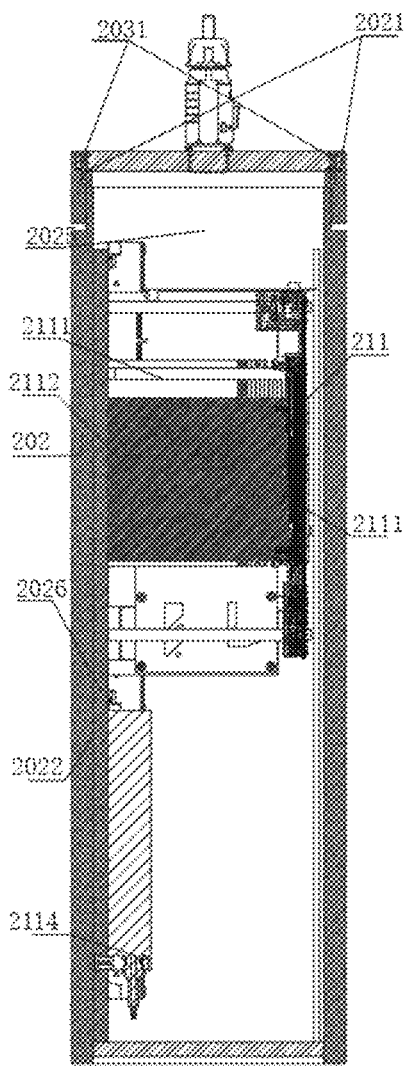
FIG. 49 is a sectional view taken along line T-T of FIG. 48.
Figure 50:
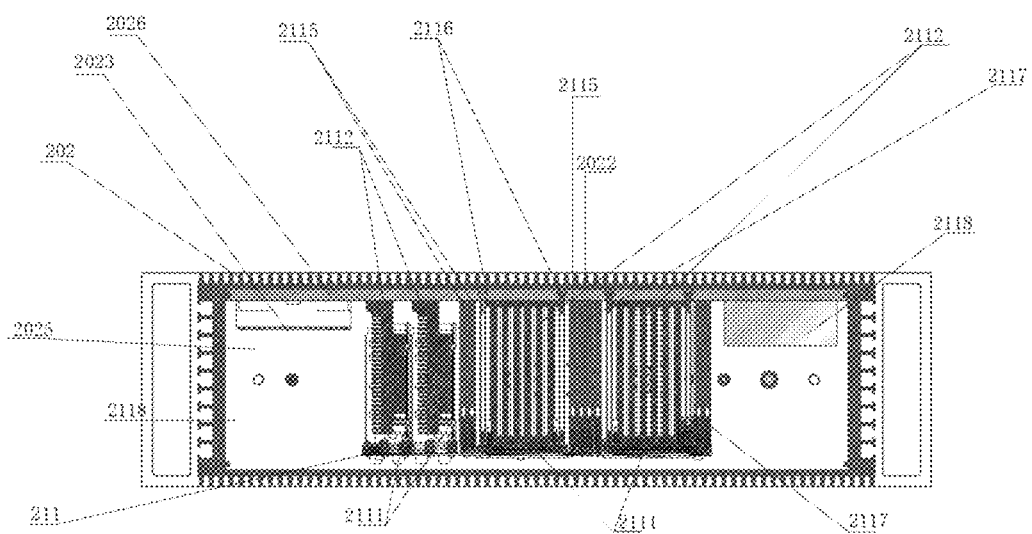
FIG. 50 is a sectional view taken along line U-U of FIG. 48.
Figure 51:
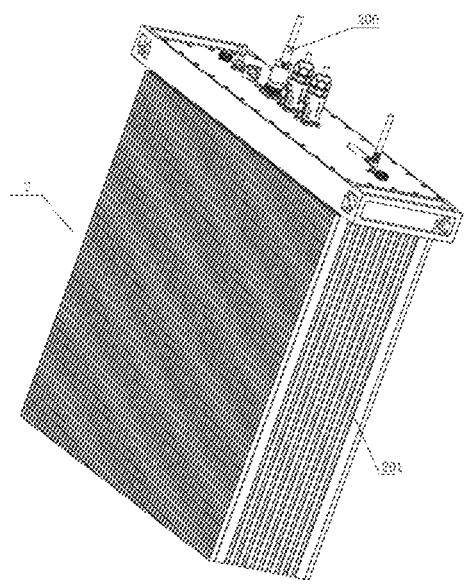
FIG. 51 is a schematic diagram of the server structure in a liquid-cooled server system according to the Embodiment 6 of the present invention.
Figure 52:
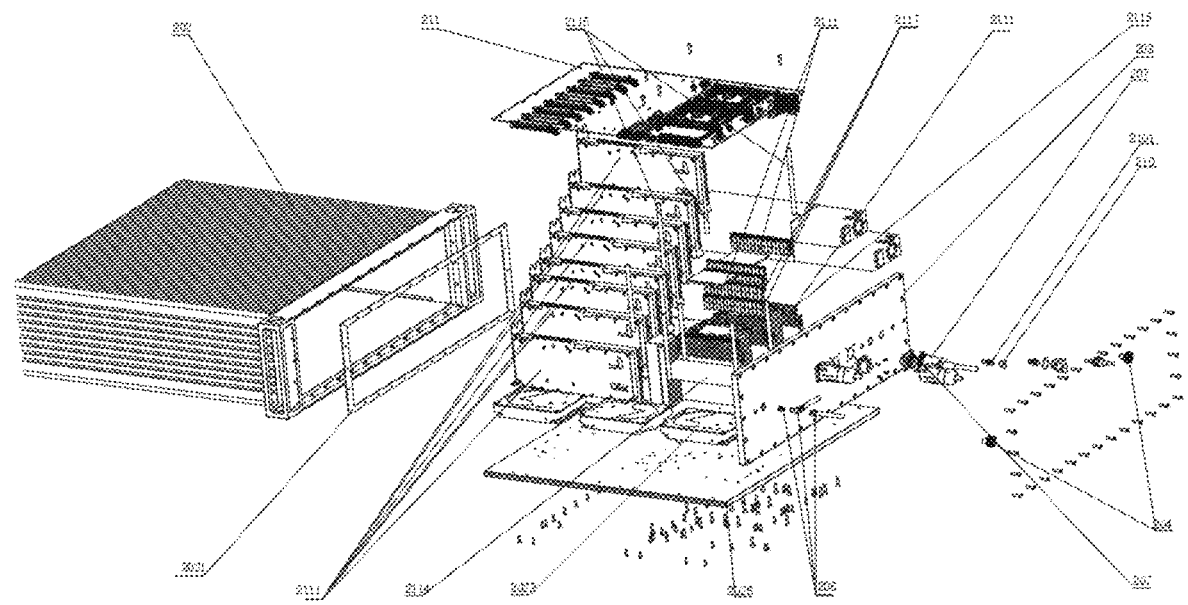
FIG. 52 is an exploded view of the structure shown in FIG. 51.
Figure 53:
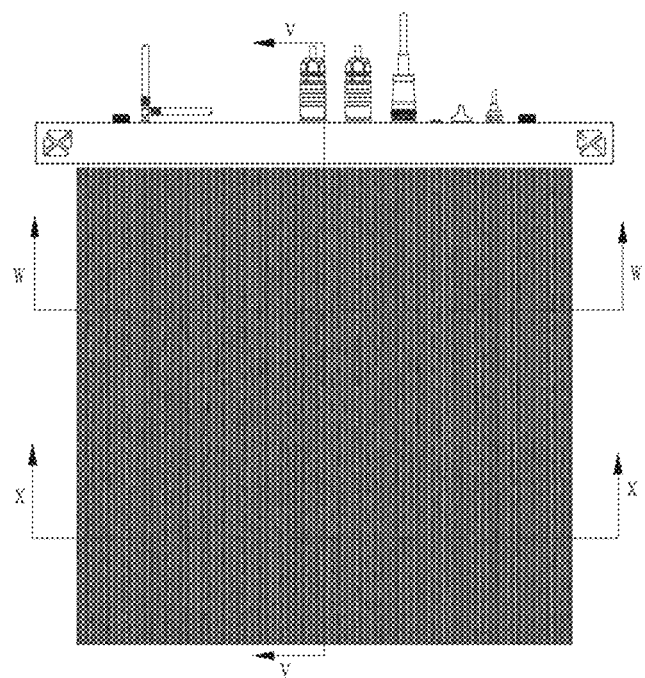
FIG. 53 is a front view of the structure shown in FIG. 51.
Figure 54:
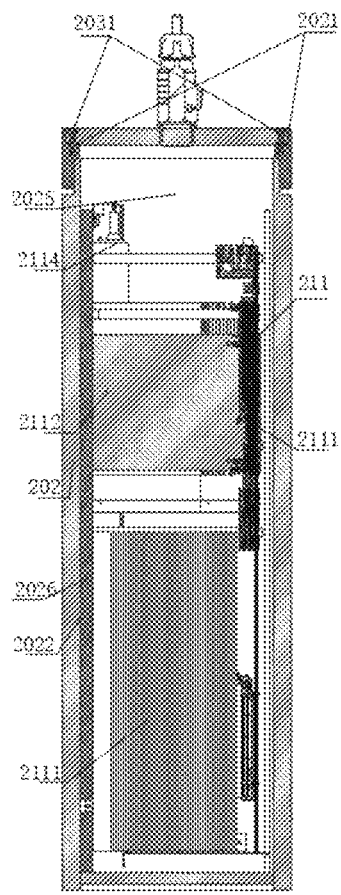
FIG. 54 is a sectional view taken along line V-V of FIG. 53.
Figure 55:
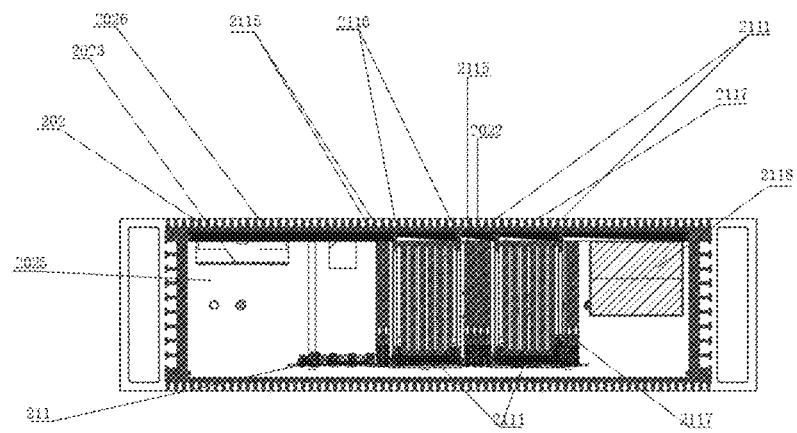
FIG. 55 is a sectional view taken along line W-W of FIG. 53.
Figure 56:
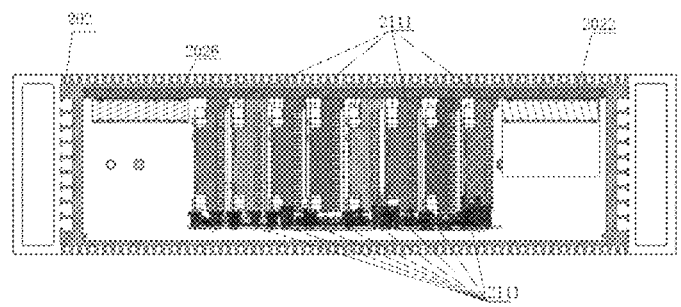
FIG. 56 is a sectional view taken along line X-X of FIG. 53.
Figure 57:
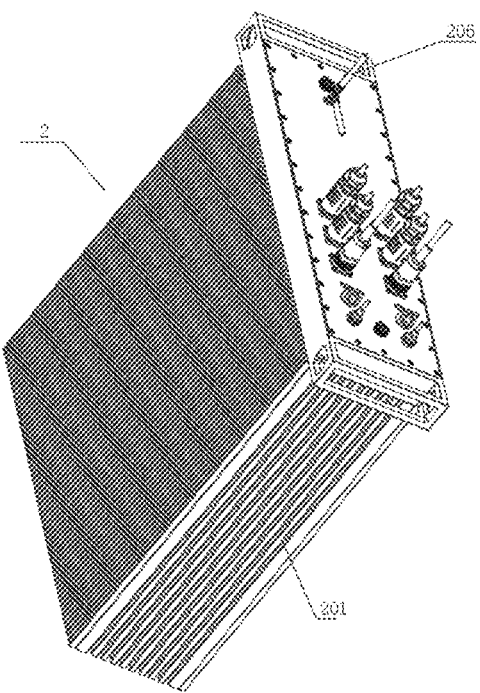
FIG. 57 is a schematic diagram of the server structure in a liquid-cooled server system according to the Embodiment 7 of the present invention.
Figure 58:
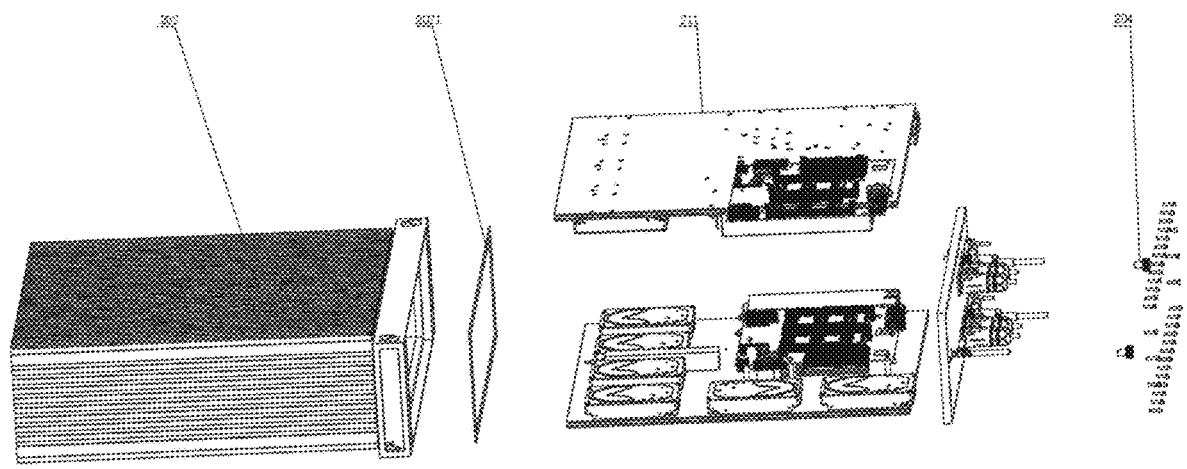
FIG. 58 is an exploded view of the structure shown in FIG. 57.
Figure 59:
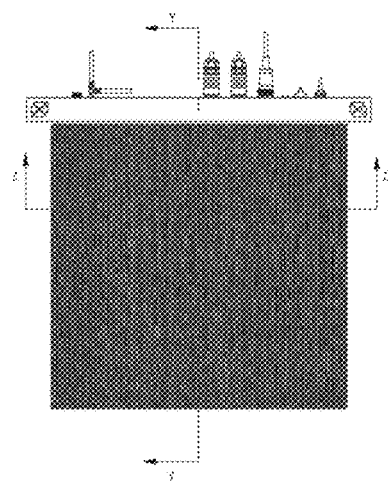
FIG. 59 is a front view of the structure shown in FIG. 57.
Figure 60:
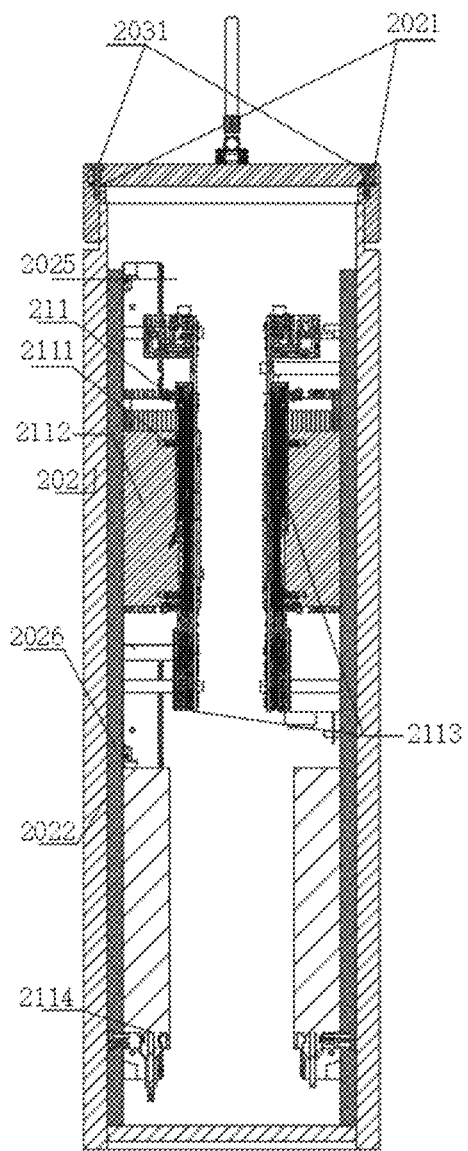
FIG. 60 is a sectional view taken along line Y-Y of FIG. 57.
Figure 61:
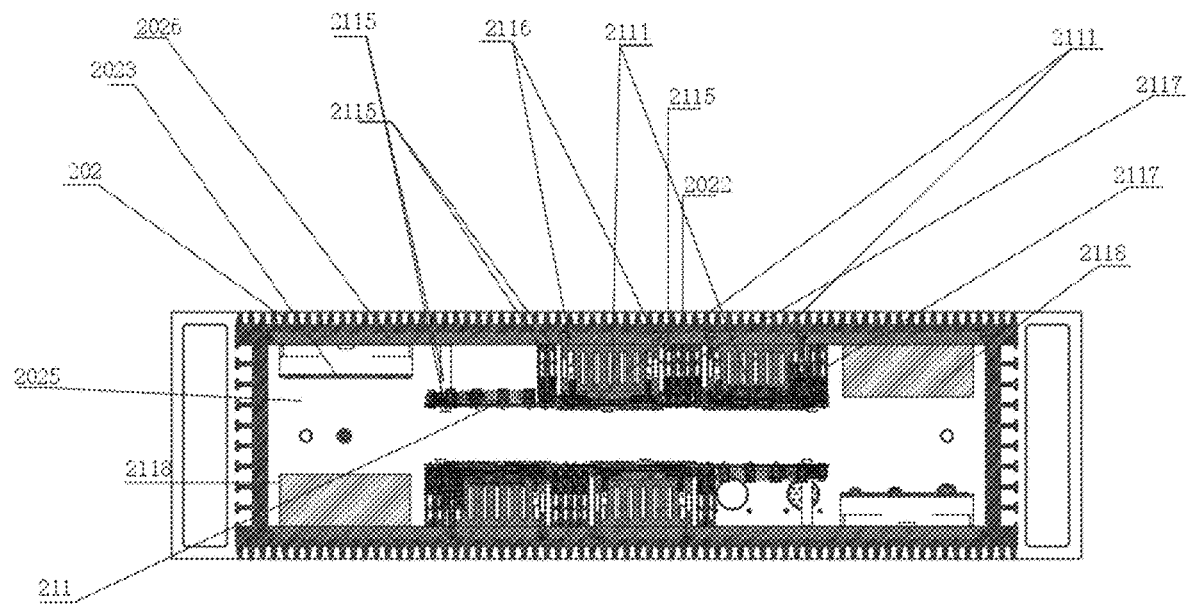
FIG. 61 is a sectional view taken along line Z-Z of FIG. 57.
Figure 62:
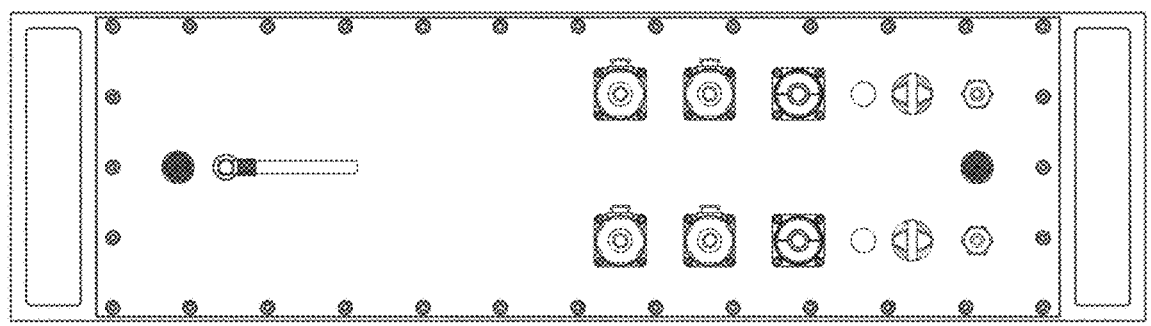
FIG. 62 is a top view of the structure shown in FIG. 57.

FIGS. 33-34 show another suspension connection method for the server 2. In this embodiment, eight servers 2 are suspended on each side of the server positioning frame 105, resulting in smaller gaps between the sides of each server 2 and a smaller width for each server 2. A total of sixty-four servers 2 are suspended in this embodiment.

Embodiment 4

FIGS. 35-45 display the structure of the server 2 in this embodiment. The sealed cover 203 of the server 2 is hermetically connected to the heat-dissipating finned housing 202 through a sealing nut 2031 and a sealing washer 2021.

The handle positioning grip 2032 is of an open-type design, and cooperates with the T-shaped handle 1051 and the server positioning connection screw 1053 for positioning and locking. The T-shaped alignment channel 201 corresponds to the server positioning slot 1052 and is in sliding limit-fit cooperation.

The wiring output terminal includes a waterproof data interface 205 extending from the top sealed cover 203, a waterproof output data cable 207, a waterproof power reset button 208, a waterproof power cable connection terminal 209, a waterproof RF antenna 206, and an exhaust valve 204. The surface of the sealed cover 203 is equipped with an indicator light 2101 installed via an indicator light nut sealing cover 210.

In this embodiment, the electrical components of the server are arranged on one side of the inner wall of the heat-dissipating finned housing 202, and the width of the server 2 is relatively narrow.

The electrical components of the server include a heat collecting plate 2026 installed on the positioning protrusion of the inner wall of the heat-dissipating finned housing 202 via the installation guide groove 20261. A memory heat sink array group 2115, memory module 2117, GPU heat sink array group, and GPU are mounted on the heat collecting plate 2026 via heat collection bolts 2116. Also mounted on the heat collecting plate 2026 are an HDD hard drive 2023, server power supply 2118, and an intelligent temperature, humidity, and oxygen controller 2114. The server motherboard 211 is mounted via positioning bolts 2444 on the motherboard mounting. The CPU group 2111, CPU heat sink 2112, and computing unit assembly 2113 are mounted on the CPU bracket 21111 of the server motherboard 211.

Wherein, a thermal conductive film 2022 is arranged between the heat collecting plate 2026 and the inner wall of the heat-dissipating finned housing 202.

Wherein, the server interior is filled with nitrogen 2025.

Embodiment 5

FIGS. 46-50 illustrate the second type of server 2. Compared to the server structure in the Embodiment 4, this server has a wider width and more electrical components and devices installed.

Embodiment 6

FIGS. 51-56 show the third type of server 2. Compared to the server structure in the Embodiment 5, this server has a wider width and more electrical components and devices installed.

Embodiment 7

FIGS. 57-62 present the fourth type of server 2. Compared to the server structures in the Embodiments 4-6, the difference is that the electrical components and devices of the server are arranged on both sides of the inner wall of the heat-dissipating finned housing 202 with a defined relative spacing. The wiring output terminals outputting from the sealed cover 203 are arranged in two rows.

The technical solution discloses the corresponding liquid-cooled server system in embodiments. The coolant tank structure of the liquid-cooled server is within the protection scope of the technical solution, as well as the independent configurations of both the coolant tank structure and the liquid-cooled server within the system.

The preferred embodiments of the present invention disclosed herein above are merely used to facilitate the explanation of the present invention. These embodiments neither exhaustively describe all details nor confine the scope of the invention solely to the specific embodiments described. Clearly, many variations and modifications may be made without departing from the spirit and scope of the present invention. The specific embodiments have been selected and described to best illustrate the principles of the present invention and its practical application, thereby enabling others skilled in the art to understand and make use of the present invention. The present invention is defined solely by the claims and their full scope and equivalents.

What is claimed is:

1. A liquid-cooled server system, it comprises a coolant liquid tank structure having a trough-shaped sealed inner liner and a liquid-cooled server immersed below a coolant liquid level within said coolant liquid tank structure;
   the coolant liquid tank structure includes a lower sealing plate peripherally disposed about the trough-shaped sealed liner;
   an upper sealing plate superjacent to the lower sealing plate;
   at least one power-signal bridge adjustably mounted to a positioning frame reinforcement ribs on a crossbeam atop the trough-shaped liner;
   a server positioning frame interposed between opposing the positioning frame reinforcement ribs; a coolant monitoring device disposed beneath the server positioning frame; a coolant feed mechanism arranged on one side of the coolant liquid tank structure;
   a coolant outlet mechanism arranged on an opposite side of the coolant liquid tank structure; and
   a tank control module located laterally on the lower sealing plate;
   the liquid-cooled server is suspended from the server positioning frame in an array configuration within the coolant liquid tank structure, with a bottom of the liquid-cooled server submerged below the coolant level and an output terminal of the liquid-cooled server located at a top of the liquid-cooled server;
   the liquid-cooled server is in the form of a rectangular box, comprising a sealed heat-dissipating finned housing, a sealing cover with handgrip positioning lugs at bilateral top edges, and an internal electrical components; and
   alignment and suspension are achieved via interaction between T-shaped alignment channels on lateral surfaces of said sealed heat-dissipating finned housing and said handgrip positioning lugs with the server positioning frame.

2. The liquid-cooled server system according to claim 1, wherein the sealing cover is hermetically connected to the sealed heat-dissipating finned housing via sealing nuts and sealing gaskets.

3. The liquid-cooled server system according to claim 1, wherein said handgrip positioning lugs are apertured and cooperatively engage with T-shaped handles and positioning bolts; and the T-shaped alignment channel corresponds to a server positioning slot for slidable positioning and limit engagement.

4. The liquid-cooled server system according to claim 1, wherein the output terminal of the liquid-cooled server comprises a waterproof data port extending from a top of the sealing cover, a waterproof output data cable, a waterproof power reset button, a waterproof power terminal, a waterproof RF antenna, and an exhaust valve; and a sealing cover surface is provided with an indicator light sealed via an indicator nut.

5. The liquid-cooled server system according to claim 1, wherein the internal electrical components of the liquid-cooled server are disposed along at least one inner wall of the sealed heat-dissipating finned housing.

6. The liquid-cooled server system according to claim 5, wherein the internal electrical components include: a heat collecting plate mounted via a guide groove onto a positioning protrusion on the inner walls of the sealed heat-dissipating finned housing, a memory heat sink array assembly, memory modules, a GPU heat sink array assembly, a GPU, and a chip heat sink mounted on the heat collecting plate via heat sink bolts; the heat collecting plate comprises an HDD, a server power module, and an intelligent temperature-humidity-oxygen controller mounted on the heat collecting plate; and
   a server motherboard is fixed via motherboard positioning bolts, and the server motherboard supports a CPU group, a CPU heat sink, a GPU array, and a computational unit module installed via a CPU bracket.

7. The liquid-cooled server system according to claim 6, wherein the thermally conductive film is disposed between the heat collecting plate and the inner wall of the sealed heat-dissipating finned housing.

8. The liquid-cooled server system according to claim 6, wherein an interior of the liquid-cooled server is filled with nitrogen gas.

9. The liquid-cooled server system according to claim 1, wherein the lower sealing plate of the coolant liquid tank structure is detachably connected to a corner vertical beam of the trough-shaped sealed liner via side sealing plate mounting hooks and panel mounting holes; and
   cable routing slots are formed on the corner vertical beam for cable management.

10. The liquid-cooled server system according to claim 1, wherein the power-signal bridge is configured as a gantry structure, with a bottom end of the gantry structure interlocked to the crossbeam atop of the trough-shaped sealed liner via an inverted U-shaped engaging structure; and
    the server positioning frame is connected to the positioning frame reinforcement ribs through a connector plate via positioning holes and bolts.

11. The liquid-cooled server system according to claim 10, wherein a PDU power interface is disposed within a upper crossbeam of the power-signal bridge and covered with a bridge cover plate; and
    wire outlet holes are spaced apart between both sides of the upper crossbeam.

12. The liquid-cooled server system according to claim 1, wherein multiple server positioning slots are laterally spaced on both sides of the server positioning frame, and two rows of server positioning connection screws with T-shaped handles, and the upper ends of the T-shaped handles are threadably mounted on the server positioning frame.

13. The liquid-cooled server system according to claim 1, wherein a sensor mounting beam is mounted to a bottom of the server positioning frame via connecting member, and the sensor mounting beam is equipped with refrigeration liquid monitoring devices by means of sensor beam fixing bolts; and
    the refrigeration liquid monitoring devices comprise a high-level temperature sensor, a mid-level temperature sensor, a low-level temperature sensor, and a liquid level sensor.

14. The liquid-cooled server system according to claim 1, wherein the coolant feed mechanism comprises a feed chamber, a plurality of feed distribution pipes connected to an upper portion of the feed chamber, and a main feed pipe connected to the plurality of feed distribution pipes; the main feed pipe is fixed by a valve pipe positioning clamp and is provided at an inlet end of the main feed pipe with a main inlet solenoid valve, an inlet flow sensor, and a manual main valve; and
    a fluid inlet opening in communication with the trough-shaped sealed liner is formed between the feed chamber and the trough-shaped sealed liner.

15. The liquid-cooled server system according to claim 1, wherein the coolant outlet mechanism comprises a drainage overflow chamber, a plurality of drainage overflow branch pipes connected to a bottom of the drainage overflow chamber, a drain pipe connected to the plurality of drainage overflow branch pipes, a drainage flow sensor mounted on the drain pipe, and an electromagnetic drainage valve; and
    the crossbeam atop of the trough-shaped sealed liner, located on the same side as the drainage overflow chamber, is formed with drainage overflow level ports spaced laterally and in communication with the drainage overflow chamber.

16. The liquid-cooled server system according to claim 1, wherein the tank control module comprises a controller electrically connected to a level transmitter, a switch, a power circuit breaker, an emergency brake switch for the coolant liquid tank structure, a forced inlet button, and a forced drainage button; the power circuit breaker is mounted at a rear of an opening formed in the lower sealing plate of the coolant liquid tank structure via a DIN rail and secured and sealed using a power compartment cover and power compartment cover mounting bolts.

17. The liquid-cooled server system according to claim 1, wherein a bottom of the coolant liquid tank structure is provided with a coolant liquid tank support feet.

18. The liquid-cooled server, wherein the liquid-cooled server comprises the structural features of the liquid-cooled server system according to claim 1.

19. The coolant liquid tank structure for the liquid-cooled server, wherein the coolant liquid tank structure comprises the structural features of the coolant liquid tank structure in the liquid-cooled server system according to claim 1.

\* \* \* \* \*